US008489661B2

(12) United States Patent
Melanson

(10) Patent No.: US 8,489,661 B2
(45) Date of Patent: Jul. 16, 2013

(54) SIGNAL PROCESSING SYSTEM WITH A DIGITAL SAMPLE RATE CONVERTER

(75) Inventor: John L. Melanson, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 1274 days.

(21) Appl. No.: 11/610,861

(22) Filed: Dec. 14, 2006

(65) Prior Publication Data

US 2008/0147761 A1 Jun. 19, 2008

(51) Int. Cl.
G06F 17/17 (2006.01)
G06F 7/38 (2006.01)

(52) U.S. Cl.
USPC .......................................... 708/313; 708/290

(58) Field of Classification Search
USPC .......................................... 708/290, 300–323
See application file for complete search history.

(56) References Cited

U.S. PATENT DOCUMENTS

| 4,422,156 | A | * | 12/1983 | Sano .............................. 708/320 |
| 4,584,659 | A | * | 4/1986 | Stikvoort ....................... 708/313 |
| 5,732,002 | A | * | 3/1998 | Lee et al. ....................... 708/313 |
| 5,732,107 | A | * | 3/1998 | Phillips et al. ................ 375/296 |
| 6,041,339 | A | * | 3/2000 | Yu et al. ......................... 708/313 |
| 6,208,671 | B1 | * | 3/2001 | Paulos et al. .................. 370/545 |
| 6,584,162 | B1 | * | 6/2003 | Tinker ............................ 375/355 |
| 6,608,572 | B1 | * | 8/2003 | Venkitachalam et al. ...... 341/61 |
| 7,253,753 | B2 | * | 8/2007 | Wu et al. ........................ 341/61 |
| 7,259,700 | B2 | * | 8/2007 | Heeb .............................. 341/61 |
| 7,262,717 | B2 | * | 8/2007 | Melanson et al. .............. 341/61 |
| 2005/0235022 | A1 | * | 10/2005 | Kogure .......................... 708/300 |

OTHER PUBLICATIONS de Carvalho, J.M.; Hanson, J.V.;, "Efficient sampling rate conversion with cubic splines," SBT/IEEE International Telecommunications Symposium, pp. 439-442, 3-6 1990.*
Babic, D.; Renfors, M.;, "Flexible down-sampling using CIC filter with non-integer delay," IEEE International Symposium on Circuits and Systems, vol. 2, pp. 285-288, 2002.*
M. P. Donadio, CIC Filter Introduction, 2000, retrieved from http://www.mikrocontroller.net/attachment/51932/cic2.pdf.*
Alan V. Oppenheim, Ronald W. Schafer, John R. Buck, "Discrete-Time Signal Processing", Second Edition, Pearson Education Inc, 1999, pp. 196-187 and 468-475.*
D. Babic, J. Vesma, M. Renfors, "Decimation by non-integer factor using CIC filter and linear interpolation," in: Proceedings of the Finnish Signal Processing Symposium FINSIG 2001, Espoo, Finland, May 2001, pp. 1-4.*
T. A. Ramstad, "Digital methods for conversion between arbitrary sampling frequencies", IEEE Trans. Acoust., Speech, Signal Processing, vol. ASSP-32, pp. 577-591, 1984.*

* cited by examiner

Primary Examiner — Chuong D Ngo
Assistant Examiner — Matthew Sandifer
(74) Attorney, Agent, or Firm — Terrile, Cannatti, Chambers & Holland, LLP; Kent B. Chambers

(57) ABSTRACT

A signal processing system includes a digital sample rate converter to convert a signal sampled at a first sampling frequency into a corresponding signal sampled at a second sampling frequency. In at least one embodiment, the sample rate converter includes a digital sample rate conversion filter. The digital sample rate conversion filter includes a digital filter that models a continuous time filter such as a low pass RC filter and generates filtered samples. The digital sample rate conversion filter also includes an interpolation filter that determines samples between the digital filtered samples. A sample selector selects the samples generated by the interpolation filter at the second sampling frequency. In at least one embodiment, the sample selector determines when to generate interpolated samples and the amount of time offset from an adjacent sample generated by the digital filter.

34 Claims, 27 Drawing Sheets

```
(*
Mathematica program to show design of an SRC based on discrete-
 time simulation of a continuous-time lowpass filter
 The example prototpye filter is a single-pole low-pass RC
 The discrete-time input is converted to a virtual continuous time system
 by linear interpolation.
  The resulting system response in mathematically simulated to derive a function
  that can estimate samples between the input samples.

This is used to build an SRC

John Melanson / Cirrus Logic
*)

(*
 First are some display utilites to show frequency response
*)

disph[fs_, h_] := Module[{res, ww},
        (* Plot the transfer sunctions *)
        res[x_] = h /. zm -> x;
        ww = N[2*π*I/fs];
        Show[GraphicsArray[{Plot[20*Log[10, Abs[res[Exp[ww*x]]]],
        {x, 0, 40000}, DisplayFunction -> Identity, PlotRange -> All],
             Plot[20*Log[10, Abs[res[Exp[ww*x]]]], {x, 0, fs/2},
        PlotRange -> {-200, 0}, GridLines -> Automatic, DisplayFunction -> Identity]
        }, ImageSize -> 72*8, GraphicsSpacing -> .05, Frame -> True]];
];
```

Figure 6

```
disph4[up_, fs_, h_] := Module[{res, ww},
      (* Plot the transfer functions, upsampled filter *)
      res[x_] = h /. zm -> x;
      ww = N[2*π*I/(fs*up)];
      Show[GraphicsArray[{{Plot[20*Log[10, Abs[res[Exp[ww*x]]]],
       {x, 0, 50000}, PlotRange -> All, DisplayFunction -> Identity],
           Plot[20*Log[10, Abs[res[Exp[ww*x]]]], {x, 0, up*fs/2},
       PlotRange -> {-200, 0}, GridLines -> Automatic, DisplayFunction -> Identity]},
      {Plot[20*Log[10, Abs[res[Exp[ww*x]]]], {x, fs - 20000, fs + 20000},
       PlotRange -> {-220, -120}, GridLines -> Automatic, DisplayFunction -> Identity],
       Plot[20*Log[10, Abs[res[Exp[ww*x]]]], {x, 2 fs - 20000, 2 fs + 20000},
       PlotRange -> {-220, -120}, GridLines -> Automatic, DisplayFunction -> Identity]}
       }, ImageSize -> 72*8, GraphicsSpacing -> .05, Frame -> True]];
];
disphalias[up_, fs_, h_] := Module[{res, ww},
      (* Plot the alias sum *)
      res[x_] = h /. zm -> x;
      ww = N[2*π*I/(fs*up)];
      Plot[10*Log[10,
      Sum[Abs[res[Exp[ww*(x + i fs)]]]^2, {i, 1, up/2}]
      ], {x, -20000, 20000}, PlotRange -> All, GridLines -> Automatic];
];

(*
Make the impulse response of the desired continuous time system
  The system is a linear interpolation of the discrete time input,
followed by a low-pass RC
  Linear interpolation is equivalent to convolution with a triangle wave
  The triangle is equivalent to a ramp up and a ramp down,
or the unit boxcar self-convolved
  This is made out of three pieces.
   con1-response to ramp up (time 0-1)
  con2- response durint ramp down (time 1-2)
  con3- response after ramp (time >2)

logalph is the natural log of the
  discrete steped delay.  It will be the log of a number
  sligthly less than one.  It defines the rc time constant
```

*Figure 7*

```
*)
nat = Exp[x logalph]; imp = Exp[t logalph];
con1 = Integrate[imp * (x - t), {t, 0, x}];
Plot[.04 con1 /. logalph -> Log[1 - .04], {x, 0, 1}];
con2 = Integrate[imp * (2 - x + t), {t, 0, x - 1}] + Integrate[imp * (x - t), {t, x - 1, x}];
Plot[.04 con2 /. logalph -> Log[1 - .04], {x, 1, 2}];
con3 = Integrate[imp * (2 - x + t), {t, x - 2, x - 1}] + Integrate[imp * (x - t), {t, x - 1, x}];
Plot[.04 con3 /. logalph -> Log[1 - .04], {x, 2, 50}];
(*
  Now we need to reverse engineer the matching
    digital filter.  This will be a single pole (to match the rc),
  but with a zero.  The zero is needed to force the impulse reponse
    of the digital system to track with the analog prototype.
    cb0 and cb1 are the prototype no-delay, and delay,
  coefficients for the difference equation
    (cb0 +z^-1 cb1)/(1-logalph z^-1)
 *)
cb0 = con1 /. x -> 1;
cb1 = con2 /. x -> 2; cb1 -= cb0 (nat /. x -> 1);
(* Normalize the filter such that the dc gain =1 *)
dc = Simplify[(cb0 + cb1) / (1 - nat /. x -> 1)];
cb0 = Simplify[cb0 / dc]; cb1 = Simplify[cb1 / dc];
Print[" Typical cb0,cb1,cb0/cb1    ", {cb0, cb1, cb0 / cb1} /. logalph -> Log[1 - .04]];

(*
  f0 and f1 are the functions that will be used to create the interpolations
    f0 is the response to a newly arrived sample, it's just con1 normalized for dc
    f1 is the response to a sample arrived in the previous period.  It's con2,
  offset in time by one,
  but with the impact to the state varible taken into
    account.  The  s.v. part will decay at the natural rc time constant
    Past the second time period, all effects will be incorporated
    into the state variables, so there is no f function needed
 *)
f0 = Simplify[con1/dc]; f1 = Simplify[((con2 /. x -> x + 1) - (con1 /. x -> 1) * nat) / dc];
Print[" cb0,cb1,cb1/cb2, f0 f1 nat-> \n", {cb0, cb1, Simplify[(cb1 / cb0)], f0, f1, nat}];
```

Figure 8

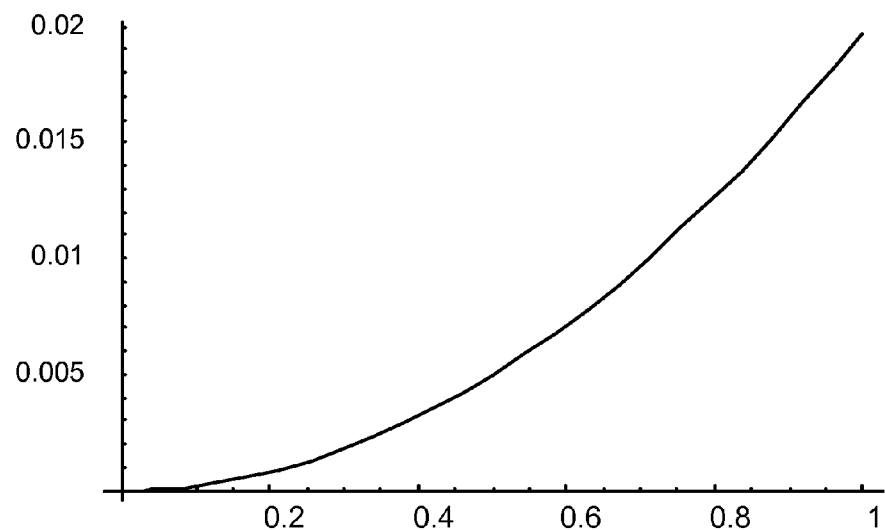
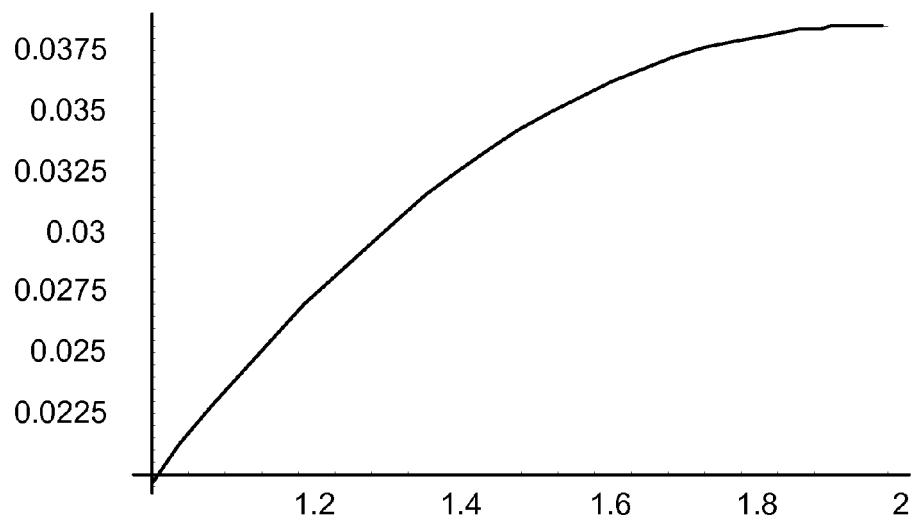
Figure 9

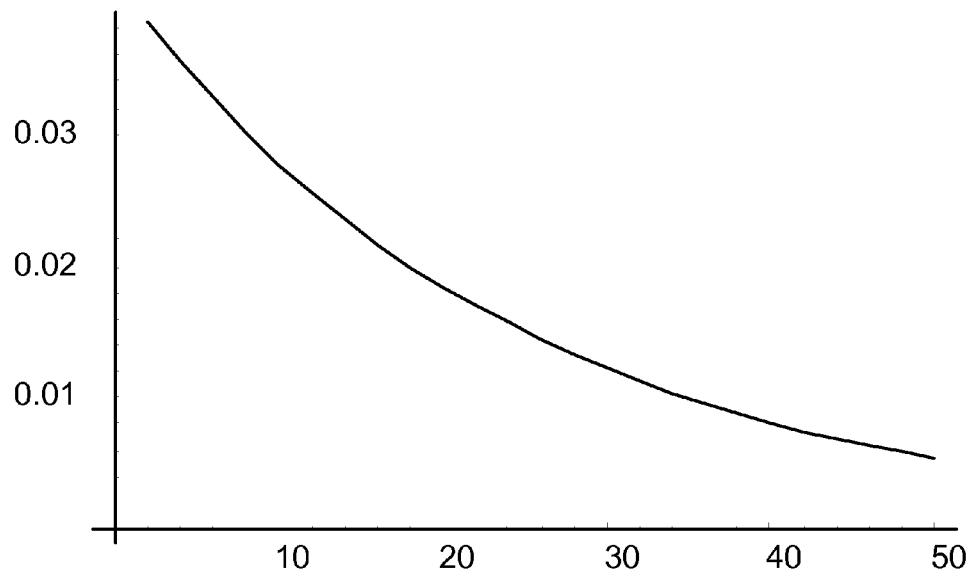

```
Typical cb0,cb1,cb0/cb1    {0.0201361,0.0198639,1.0137} cb0,cb1,cb1/cb2, f0 f1 nat->
```

$$\left\{\frac{1 - e^{\text{logalph}} + \text{logalph}}{\text{logalph}}, -\frac{1 + e^{\text{logalph}}(-1 + \text{logalph})}{\text{logalph}}, \frac{1 + e^{\text{logalph}}(-1 + \text{logalph})}{-1 + e^{\text{logalph}} - \text{logalph}},\right.$$

$$\left.\frac{1 - e^{\text{logalph}\,x} + \text{logalph}\,x}{\text{logalph}}, \frac{-1 - e^{\text{logalph}\,x}(-1 + \text{logalph}) + \text{logalph} - \text{logalph}\,x}{\text{logalph}}, e^{\text{logalph}\,x}\right\}$$

Figure 10

```
(*
 Now we will re-structure the interpolator output into 3 parts
   The discrete time output
   The linear interpolation of those outputs
   A non-linear correction term to the above that is 0 at the endpoints (0,1)

Here we will show that the non-linear term is of the same form for the input
     (terms due to the change in the input) and for the output change
   This allows a easier implementation
*)
fsum = Simplify[(f0 + f1) / 2]; fdif = Simplify[(f0 - f1) / 2];
fsum1 = fsum /. x -> 1;
fdif1 = fdif /. x -> 1;
(*
 Prototype filter
   Linear interpolate, upsampled
   Exp interpolate, upsampled
   Quadratic aprox to exp upsampled
*)
fs = 27. 10^6 / 4; alp = .04; up = 64;
hfsl = Simplify[((fsum1 (1 + zm) + fdif1 (1 - zm)) / (1 - (1 - 2 fsum1) zm)];
hfsl = Collect[Simplify[hfsl * (1 - zm Exp[logalph])], zm, Simplify] / (1 - zm Exp[logalph]);
(*prettier form*)
hfsup = hfsl /. zm -> zm^up; zmup = zm^up;
(* hsfl is the discrete time filter "as is"
   hfsup is the upsampled version *)

(* the non-linear term is fsum/fsum1-x  This can be approximated by a parabola of the
     form coefficient * x * (x-1).  x2 is that coefficient *)
x2 = Coefficient[Normal[Series[fsum / fsum1 - x, {x, 1/2, 2}]], x^2];

Print["hfsl = ", hfsl];
Print["bsum, bdiff, alp, x2  ",
   {fsum1 / alp, fdif1 / alp, alp, x2} /. logalph -> Log[1 - alp]];
disph[fs, hfsl /. logalph -> Log[1 - alp]];
(* over4 consists of three vectors
     The linear interpolation vector
     The exact function non-linear vector
     The quadratic aproximation to the non-linear vector All three vectors are sample with "up" sample from 0 to less than 1
     These will create the overall transfer functions
     over4 is still symbolic w.r.t. logalpha (the time constant)
```

Figure 13

```
*)
over4 = ({x, fsum/fsum1 - x, x2 x (x - 1)}) /. x -> (Range[0, up - 1] / up);
(*
 hlin is the linear interpolation verion of the output.  Upsampled by "up"
*)
hlin = Together[((
        over4[[1]] (hfsup (1 - zmup))
          + hfsup zmup)
      }.(zm^Range[0, up - 1]) / up];
(* Another form that makes the re-use of the difference equation more obvious
   Transfer function nets out the same*)
hlin = Together[((
        over4[[1]] (fsum1 (1 + zmup) + fdif1 (1 - zmup) - 2 fsum1 zmup hfsup)
          + hfsup zmup)
      }.(zm^Range[0, up - 1]) / up];
Print["Linear interpolation"];
disph4[up, fs, hlin /. logalph -> Log[1 - alp]];
(*
 hcrv is the intperolator based on the proper curve, again upsampled note how the function "works"
    (hfsup (1-zmup) - (1-zmup))
    In the non-oversampled space, for clarity, this is two terms
    hf (1-zm) ->  the output slope (same as used for linear interpolation
    (1-zm) -> the input slope The non-
     linear term is applied to the difference between the input and outpu slopes
   *)
hcrv = Together[(
        over4[[2]] (hfsup (1 - zmup) - (1 - zmup))
      }.(zm^Range[0, up - 1]) / up + hlin
   ];
(* Again, an equivalent implementation-obvious form *)
hcrv = Together[(
        over4[[2]] ((fsum1 (1 + zmup) + fdif1 (1 - zmup) - 2 fsum1 zmup hfsup) - (1 - zmup))
      }.(zm^Range[0, up - 1]) / up + hlin
```

Figure 14

```
};
Print["Proper curve"];
disph4[up, fs, hcrv /. logalph -> Log[1 - alp]];
(* Now approximate the proper curve with a parabola *)
hcrvsq = Together[(
        over4[[3]] (hfsup (1 - zmup) - (1 - zmup))
        ).(zm^Range[0, up - 1]) / up + hlin
    ];
Print["Square law approximation "];
disph4[up, fs, hcrvsq /. logalph -> Log[1 - alp]];
(*zoom in to show detail of any differences*)
Print["Accurate curve"];
disphalias[up, fs, hcrv /. logalph -> Log[1 - alp]];
Print["Parabolic fit"];
disphalias[up, fs, hcrvsq /. logalph -> Log[1 - alp]];
```

$$hfs1 = \frac{1-e^{logalph+logalph}}{logalph} - \frac{(1+e^{logalph}(-1+logalph))\,zm}{logalph}$$
$$1 - e^{logalph}\,zm$$

bsum, bdiff, alp, x2  {0.5, 0.00340174, 0.04, -0.0204096}

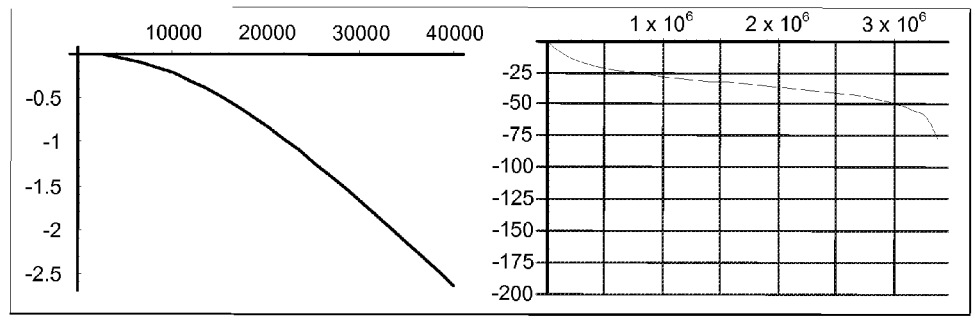

Figure 15

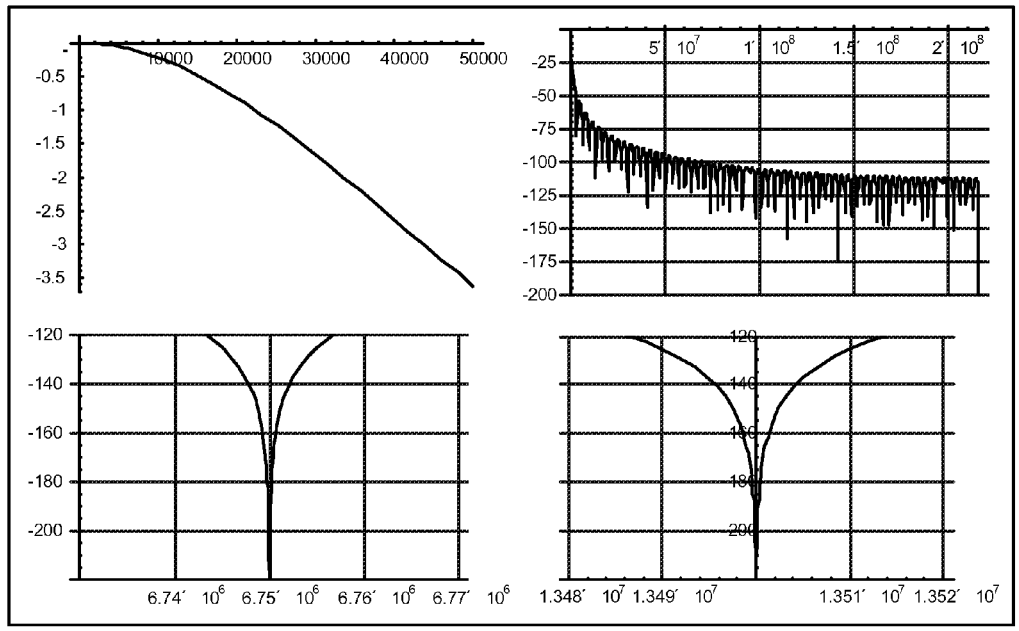
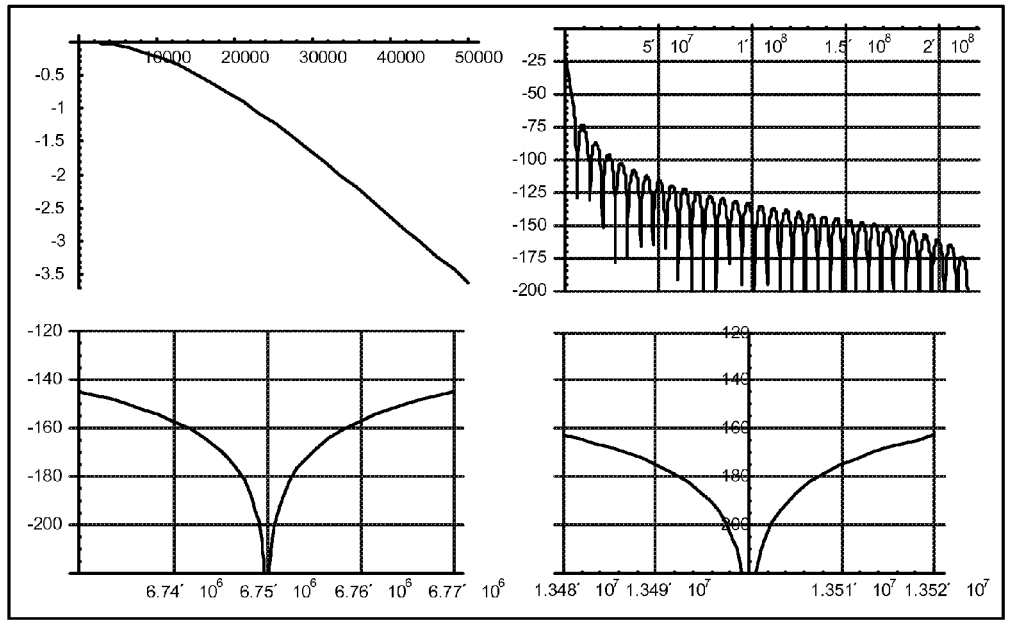
Figure 16

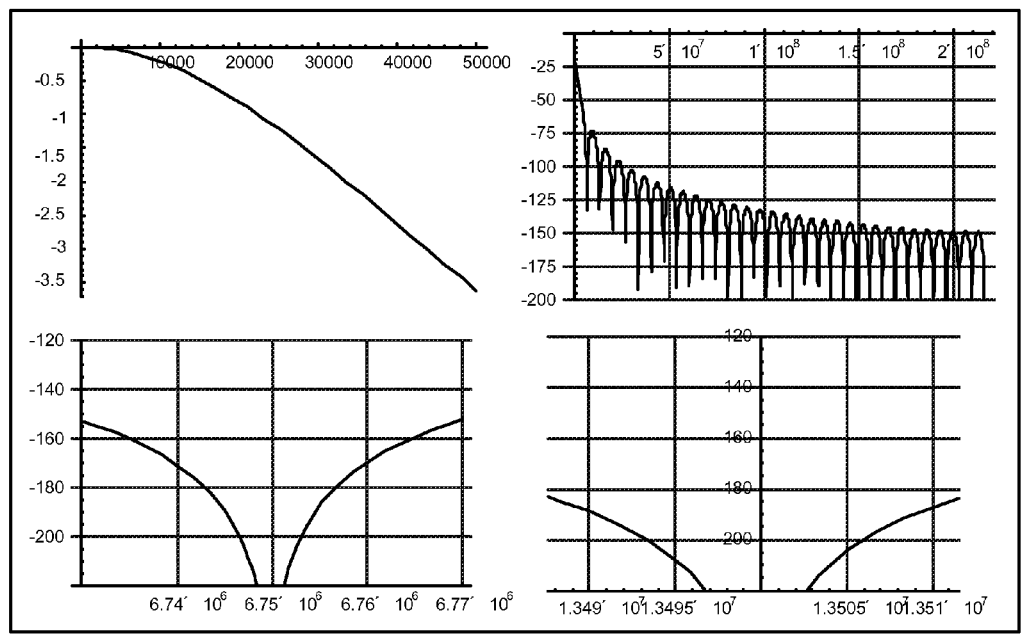
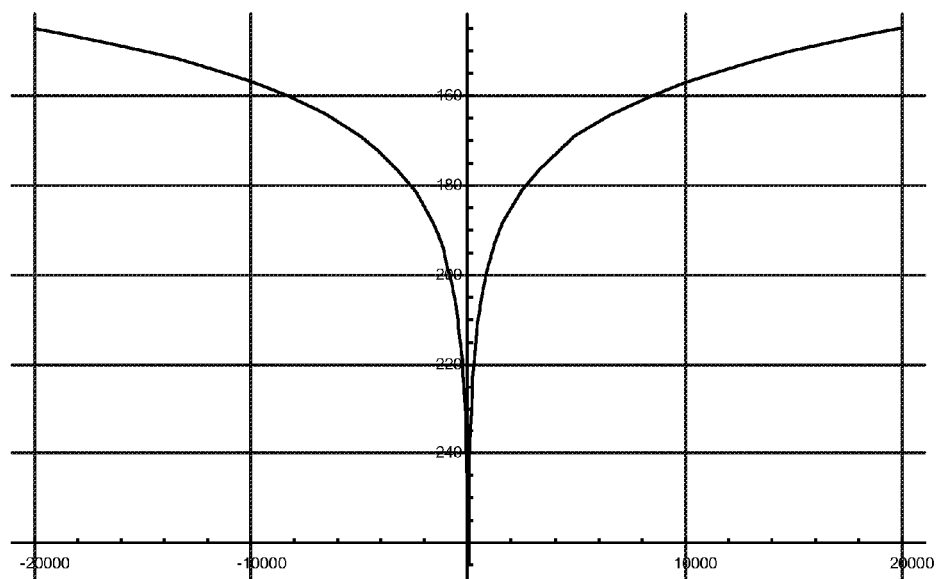
Figure 17

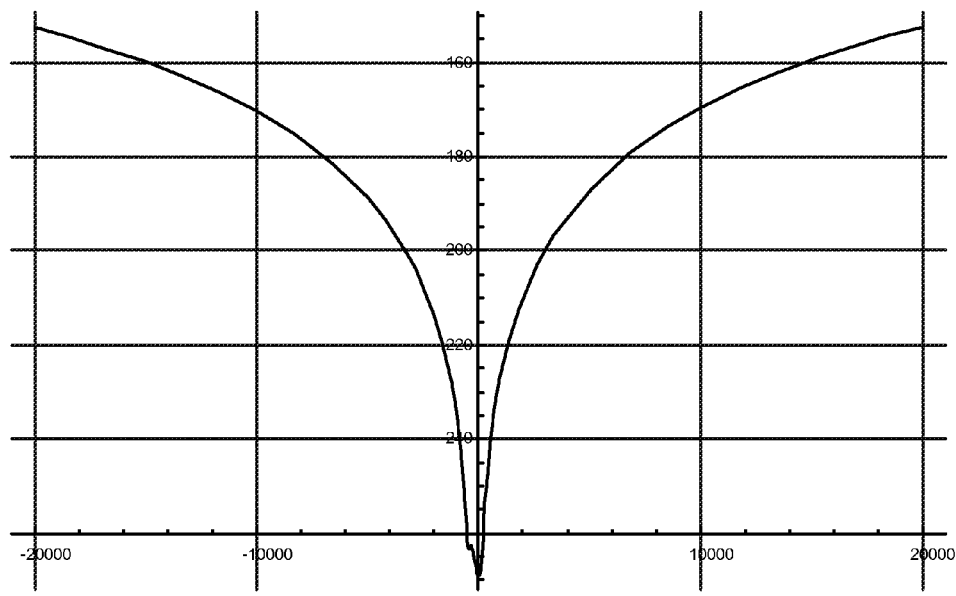
```
(* just show what the functions are for an example time constant *)
ListPlot[over4[[1]] /. logalph -> Log[.96]];
ListPlot[over4[[2]] /. logalph -> Log[.96]];
ListPlot[over4[[3]] /. logalph -> Log[.96]];
```
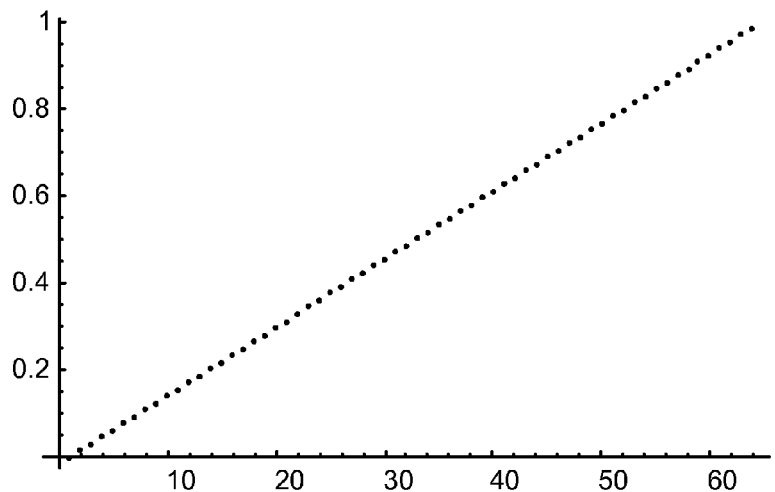
Figure 18

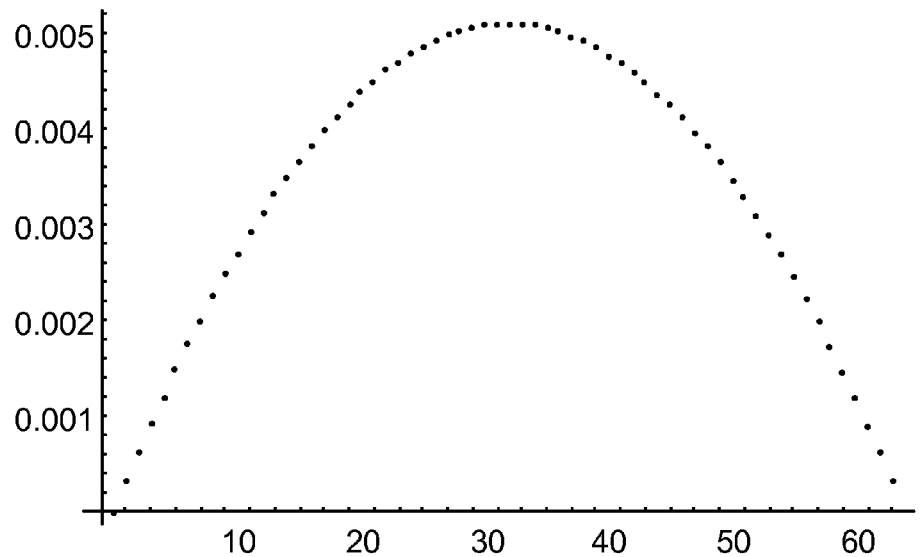
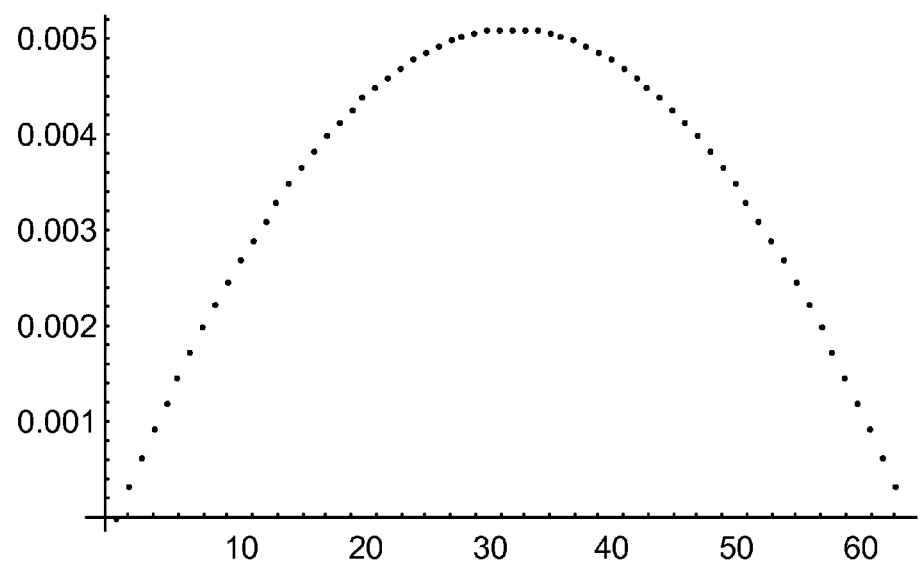
Figure 19

```
(* This program demonstrates that a SRC can
   be built using a 2nd order butterworth filter as a model
   The continuous time system is simulated by a discrete
   time system in order to ge samples between samples
   John Melanson / Cirrus Logic
*)
(* First some display utilities *)

disph[fs_, h_] := Module[{res, ww},
        (* Plot the transfer sunctions *)
        res[x_] = h /. zm -> x;
        ww = N[2*π*I/fs];
        Show[GraphicsArray[{Plot[20*Log[10, Abs[res[Exp[ww*x]]]],
        {x, 0, 40000}, DisplayFunction -> Identity, PlotRange -> All],
            Plot[20*Log[10, Abs[res[Exp[ww*x]]]], {x, 0, fs/2},
        PlotRange -> {-200, 0}, GridLines -> Automatic, DisplayFunction -> Identity]
        }, ImageSize -> 72*8, GraphicsSpacing -> .05, Frame -> True]];
];

disph4[up_, fs_, h_] := Module[{res, ww},
        (* Plot the transfer sunctions *)
        res[x_] = h /. zm -> x;
        ww = N[2*π*I/(fs*up)];
        Show[GraphicsArray[{{Plot[20*Log[10, Abs[res[Exp[ww*x]]]],
        {x, 0, 50000}, PlotRange -> All, DisplayFunction -> Identity],
            Plot[20*Log[10, Abs[res[Exp[ww*x]]]], {x, 0, up*fs/2},
        PlotRange -> {-200, 0}, GridLines -> Automatic, DisplayFunction -> Identity]},
        {Plot[20*Log[10, Abs[res[Exp[ww*x]]]], {x, fs - 20000, fs + 20000},
        PlotRange -> {-220, -120}, GridLines -> Automatic, DisplayFunction -> Identity],
        Plot[20*Log[10, Abs[res[Exp[ww*x]]]], {x, 2 fs - 20000, 2 fs + 20000},
        PlotRange -> {-220, -120}, GridLines -> Automatic, DisplayFunction -> Identity]}
        }, ImageSize -> 72*8, GraphicsSpacing -> .05, Frame -> True]];
];

disphalias[up_, fs_, h_] := Module[{res, ww},
        (* Plot the alias sum *)
        res[x_] = h /. zm -> x;
        ww = N[2*π*I/(fs*up)];
        Plot[10*Log[10,
     Sum[Abs[res[Exp[ww*(x + i fs)]]]^2, {i, 1, up/2}]
     ], {x, -20000, 20000}, PlotRange -> All, GridLines -> Automatic];
];
```

*Figure 20*

```
(* This program demonstrates that a SRC can
   be built using a 2nd order butterworth filter as a model
   The continuous time system is simulated by a discrete
   time system in order to ge samples between samples
   John Melanson / Cirrus Logic
 *)
(* First some display utilities *)

disph[fs_, h_] := Module[{res, ww},
        (* Plot the transfer sunctions *)
        res[x_] = h /. zm -> x;
        ww = N[2*π*I/fs];
        Show[GraphicsArray[{{Plot[20*Log[10, Abs[res[Exp[ww*x]]]],
        {x, 0, 40000}, DisplayFunction -> Identity, PlotRange -> All},
            Plot[20*Log[10, Abs[res[Exp[ww*x]]]], {x, 0, fs/2},
         PlotRange -> {-200, 0}, GridLines -> Automatic, DisplayFunction -> Identity]
         }, ImageSize -> 72*8, GraphicsSpacing -> .05, Frame -> True]];
];

disph4[up_, fs_, h_] := Module[{res, ww},
        (* Plot the transfer sunctions *)
        res[x_] = h /. zm -> x;
        ww = N[2*π*I/(fs*up)];
        Show[GraphicsArray[{{Plot[20*Log[10, Abs[res[Exp[ww*x]]]],
        {x, 0, 50000}, PlotRange -> All, DisplayFunction -> Identity],
            Plot[20*Log[10, Abs[res[Exp[ww*x]]]], {x, 0, up*fs/2},
         PlotRange -> {-200, 0}, GridLines -> Automatic, DisplayFunction -> Identity]},
        {Plot[20*Log[10, Abs[res[Exp[ww*x]]]], {x, fs - 20000, fs + 20000},
         PlotRange -> {-220, -120}, GridLines -> Automatic, DisplayFunction -> Identity],
         Plot[20*Log[10, Abs[res[Exp[ww*x]]]], {x, 2 fs - 20000, 2 fs + 20000},
         PlotRange -> {-220, -120}, GridLines -> Automatic, DisplayFunction -> Identity]}
         }, ImageSize -> 72*8, GraphicsSpacing -> .05, Frame -> True]];
];

disphalias[up_, fs_, h_] := Module[{res, ww},
        (* Plot the alias sum *)
        res[x_] = h /. zm -> x;
        ww = N[2*π*I/(fs*up)];
        Plot[10*Log[10,
     Sum[Abs[res[Exp[ww*(x + i fs)]]]^2, {i, 1, up/2}]
       ], {x, -20000, 20000}, PlotRange -> All, GridLines -> Automatic];
];
```

*Figure 21*

$$\frac{r1^2}{r1^2 + \sqrt{2}\ r1\ s + s^2}$$

```
(* Make two, first order systems.  One is the f set, the other the g
   One coresponds to each complex pole, split by the above partial fractions *)
f0c = Simplify[(r1 / Sqrt[2] 1 I) ComplexExpand[f0 /. logalph -> -r1 Sqrt[1/2] (1 + 1 I)]];
g0c = Simplify[(-r1 / Sqrt[2] 1 I) ComplexExpand[f0 /. logalph -> -r1 Sqrt[1/2] (1 - 1 I)]];
natc = Simplify[ComplexExpand[nat /. logalph -> -r1 Sqrt[1/2] (1 + 1 I)]];
gnatc = Simplify[ComplexExpand[nat /. logalph -> -r1 Sqrt[1/2] (1 - 1 I)]];
f1c = Simplify[(r1 / Sqrt[2] 1 I) ComplexExpand[f1 /. logalph -> -r1 Sqrt[1/2] (1 + 1 I)]];
g1c = Simplify[(-r1 / Sqrt[2] 1 I) ComplexExpand[f1 /. logalph -> -r1 Sqrt[1/2] (1 - 1 I)]];
w3 = 2 * Pi * .02;
Plot[Re[natc /. r1 -> w3], {x, 0, 100}, PlotRange -> All];
Plot[Im[natc /. r1 -> w3], {x, 0, 100}, PlotRange -> All];
```

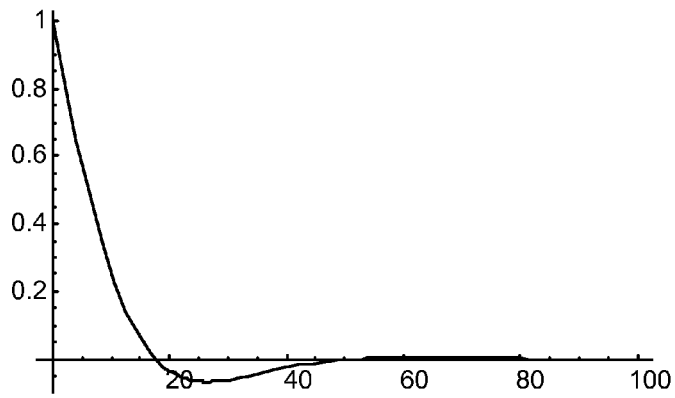

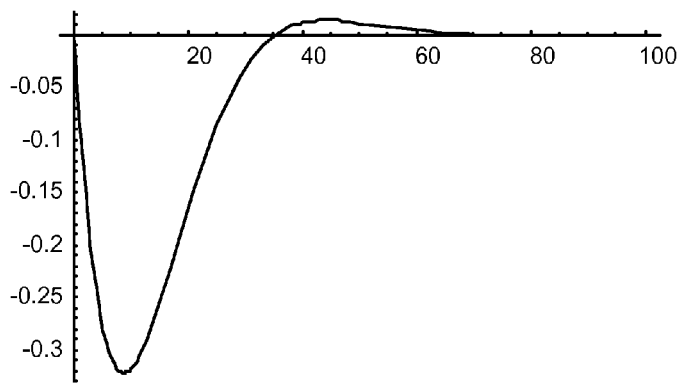

Figure 23

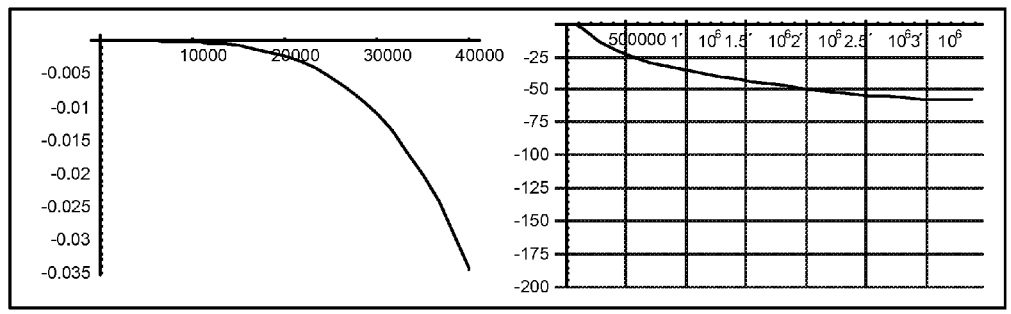

$$isv \to \frac{r1\left(e^{\sqrt{2}\,r1} + zm^2\right) - 2\,e^{\frac{r1}{\sqrt{2}}}\,r1\,zm\,\cos\left[\frac{r1}{\sqrt{2}}\right] - \sqrt{2}\,e^{\frac{r1}{\sqrt{2}}}\,(-1+zm)^2\,\sin\left[\frac{r1}{\sqrt{2}}\right]}{r1\left(e^{\sqrt{2}\,r1} + zm^2 - 2\,e^{\frac{r1}{\sqrt{2}}}\,zm\,\cos\left[\frac{r1}{\sqrt{2}}\right]\right)}$$

(*now make the interpolation function for a specific case*)

```
fiint = Simplify[{f0r, f1r, f0i, f1i, natr, nati} /. r1 -> w3];
Plot[{fiint[[1]], fiint[[2]]}, {x, 0, 1}];
Plot[{fiint[[5]], fiint[[6]]}, {x, 0, 1}];
```

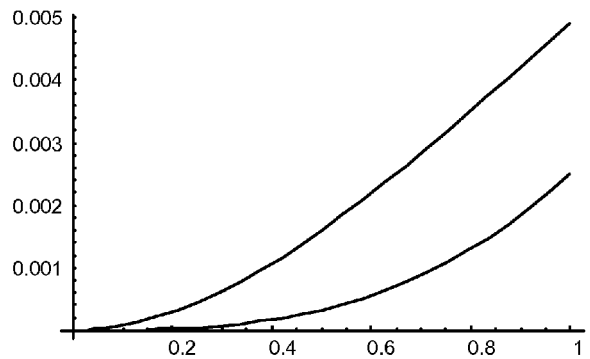

Figure 25

```
(*Show the up-sampled system response, operating as an src*)
up = 64; over4 = flint /. x -> (Range[0, up - 1] / up);
h1r = Simplify[N[(rsv /. reim) /. rl -> w3]] /. zm -> zm^up;
h1i = Simplify[N[(isv /. reim) /. rl -> w3]] /. zm -> zm^up;
zmup = zm^up;
hcomup = Together[(
        (over4[[1]] + zmup over4[[2]]) +
        zmup (over4[[5]] h1r -
            over4[[6]] h1i)
        ) . (zm^Range[0, up - 1]) / up
    ];
disph4[up, fs, hcomup];
disphalias[up, fs, hcomup];
```

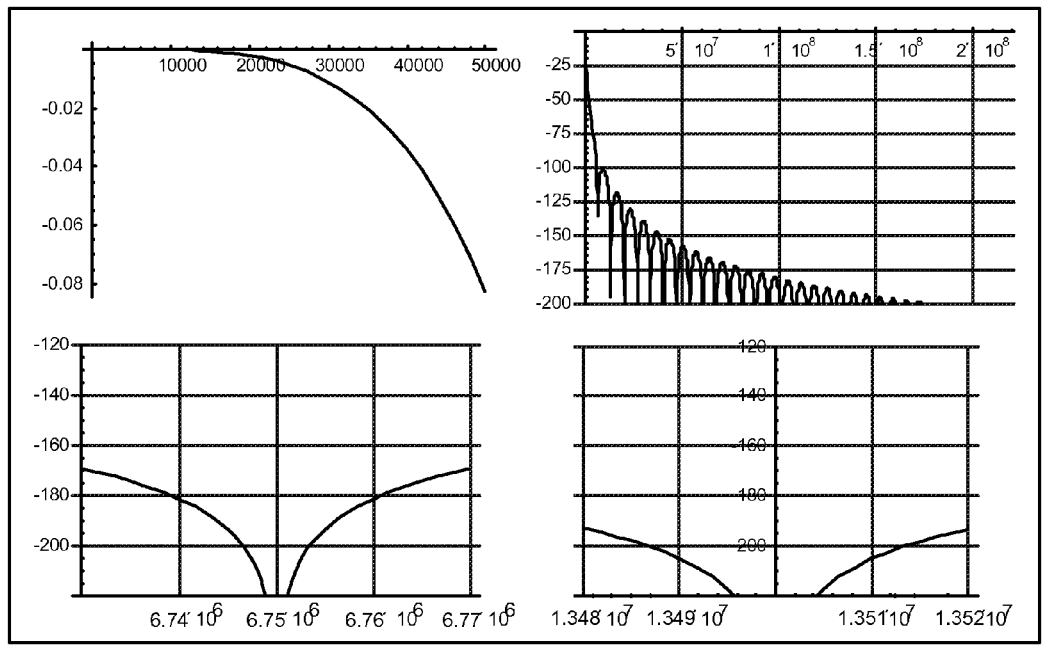
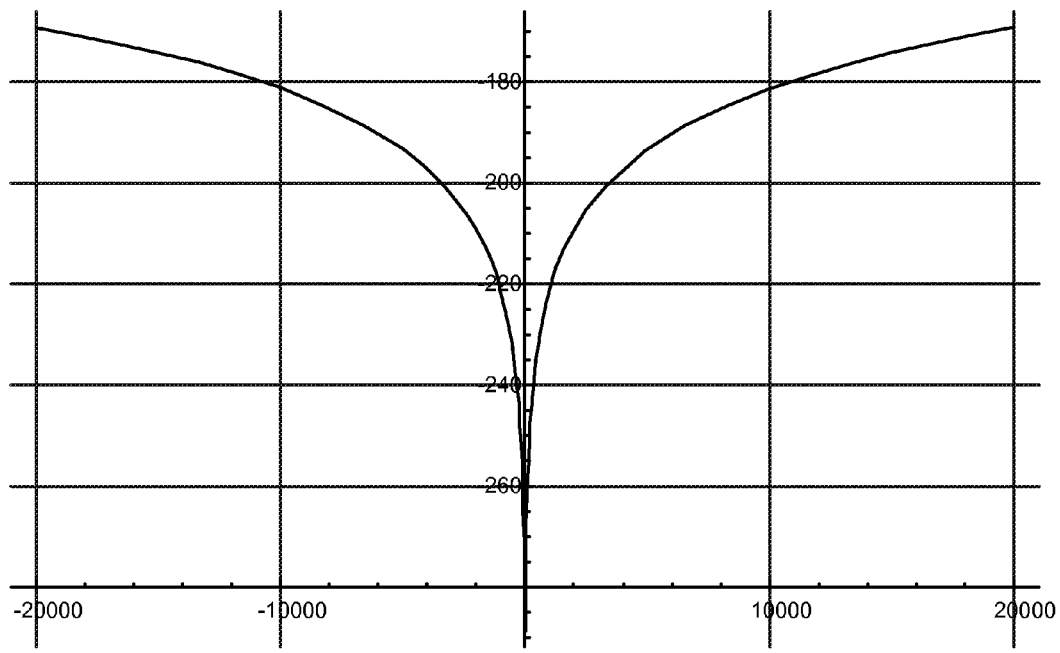
Figure 27

SIGNAL PROCESSING SYSTEM WITH A DIGITAL SAMPLE RATE CONVERTER

BACKGROUND OF THE INVENTION

1. Field of the Invention

The present invention relates in general to the field of signal processing, and more specifically, to a system and method for performing sample rate conversion using a digital sample rate converter.

2. Description of the Related Art

Mixed signal systems, i.e. combined discrete-time and continuous-time systems, process discrete- and continuous-time signals. Discrete-time signals consist of data samples that have been sampled, usually digitally, at a particular sampling frequency. Continuous-time signals consist of analog signals. In some instances, different systems utilize different sampling rates such that one data sampling frequency $fs_0$ does not match another sampling frequency $fs_1$. Sample rate converters serve as a compatibility interface to allow coupling between a system generating an output signal at sampling frequency $fs_0$ and a downstream system that processes signals having a sampling frequency $fs_1$. For example, audio signals are often sampled at either 44.1 kHz or 48 kHz. Audio signal processing systems that process signals with a sampling frequency $fs_1$ utilize a sample rate converter to convert data sampled at $fs_0$ into data sampled at 48 kHz and vice versa.

FIG. 1 depicts a conceptual, mixed signal sample rate converter (SRC) 100. SRC 100 utilizes mixed signal technology to convert a discrete-time signal having a sampling frequency $fs_0$ into a continuous-time signal and then resample the analog signal at a new sampling frequency $fs_1$. Initially, SRC 100 receives discrete-time signal x(n), having a sampling frequency $fs_0$. The digital-to-analog converter (DAC) 102 converts signal $x_0(n)$ into a continuous-time signal $y_0(t)$. An analog low pass filter 104 removes out-of-band frequencies, such as frequencies above 20 kHz for audio applications, and generates the filtered continuous-time output signal $y_1(t)$. The analog-to-digital converter (ADC) samples the continuous-time output signal $y_1(t)$ at a sampling frequency $fs_1$ and converts the analog output signal $y_1(t)$ into a discrete-time signal $y_1(n)$.

SUMMARY OF THE INVENTION

In one embodiment of the present invention, a sample rate converter includes an input to receive a discrete-time input signal, wherein the discrete-time input signal includes first discrete-time samples obtained at a sampling frequency $f_{s0}$. The sample rate converter also includes a digital sample rate conversion filter and interpolator, coupled to the input and having a transfer function modeled from a continuous-time filter, to receive the input signal and determine second discrete-time samples, at a sampling frequency $fs_1$, having values between values of adjacent-in-time samples of a subset of the first discrete-time samples, wherein $fs_0$ does not equal $f_{s1}$.

In another embodiment of the present invention, a digital sample rate converter includes a signal generator to generate a discrete-time signal having a sampled frequency of $f_{s0}$. The digital sample rate converter also includes a discrete-time filter, coupled to the signal generator, to receive the discrete-time signal, modify the discrete-time signal in accordance with a low-pass frequency operation, and generate filtered output samples and auxiliary data, wherein the auxiliary data is distinct from the filtered output signal. The digital sample rate converter also includes an interpolator to receive the auxiliary data and a subset of the filtered output samples and to determine interpolated sample values between values of the filtered output samples, wherein the interpolated sample values have a sampling frequency of $fs_1$, wherein $fs_1$ is not equal to $f_{s0}$.

In a further embodiment of the present invention, a method of converting a first sample rate of a discrete-time input signal to a second sample rate includes receiving the discrete-time input signal. The method further includes digitally filtering the discrete-time input signal using a digital model of a continuous time filter to generate first discrete-time filtered samples having a sampling frequency of $f_{s0}$. The method also includes determining second discrete-time samples, at a sampling frequency of $fs_1$, having values between values of adjacent-in-time samples of a subset of the first discrete-time samples, wherein $fs_0$ does not equal $fs_1$.

In another embodiment of the present invention, a method of converting a discrete-time input signal sampled at a frequency $fs_0$ into a discrete-time output signal sampled at a frequency $f_{s1}$ includes receiving the discrete-time input signal. The method also includes filtering the discrete-time input signal to generate filtered output samples and auxiliary data, wherein the auxiliary data is distinct from the filtered output signal. The method further includes interpolating the auxiliary data and a subset of the filtered output samples to determine the discrete-time output signal sample values between values of the filtered output samples, wherein the discrete-time output signal sample values have a sampling frequency of $fs_1$, wherein $fs_1$ is not equal to $f_{s0}$.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 6-20 depict a program and accompanying simulated signal plots depict the design and simulation of a low pass CT filter and modeling of the low pass CT filter for inclusion in a sample rate converter.

FIGS. 21-27 depict a program and accompanying simulated signal plots that depict a second order Butterworth filter.

DETAILED DESCRIPTION

A signal processing system described herein includes a digital sample rate converter to convert a signal sampled at a first sampling frequency into a corresponding signal sampled at a second sampling frequency. In at least one embodiment, the sample rate converter includes a digital sample rate conversion filter that incorporates non-linear interpolation. In at least one embodiment, the digital sample rate conversion filter models a mixed signal SRC system model. The mixed signal SRC system model emulates the response of a mixed signal SRC system, such as SRC 100. The mixed signal SRC system model includes, for example, a discrete time system with interpolation to generate a continuous time output signal followed by a continuous time filter, such as a low pass RC filter. Modeling the continuous-time filter allows the digital sample rate conversion filter to achieve lower signal-to-noise ratios (SNRs) by more accurately modeling the non-linear functions present in continuous-time low pass filters, such as analog CPF 104. The digital sample rate conversion filter is designed to simulate the mixed signal SRC system model completely in the discrete-time domain using non-linear, discrete-time interpolation.

The digital sample rate conversion filter includes a non-linear interpolation filter that determines samples between the digital filtered samples. A sample selector selects the samples generated by the non-linear interpolation filter at the second sampling frequency. In at least one embodiment, the sample selector determines when to generate interpolated samples and the amount of time offset from an adjacent sample generated by the digital filter. The digital filter can be designed using impulse invariant mapping. The digital sample rate converter can be implemented using discrete components, such as an integrated circuit, and/or as processor executable code. The digital sample rate converter can be used in any of a variety of signal processing systems, such as an analog-to-digital converter. Use of integrated digital technology to perform sample rate conversion permits the use of local clocks, which can reduce clock noise and jitter constraints.

Figure 1:
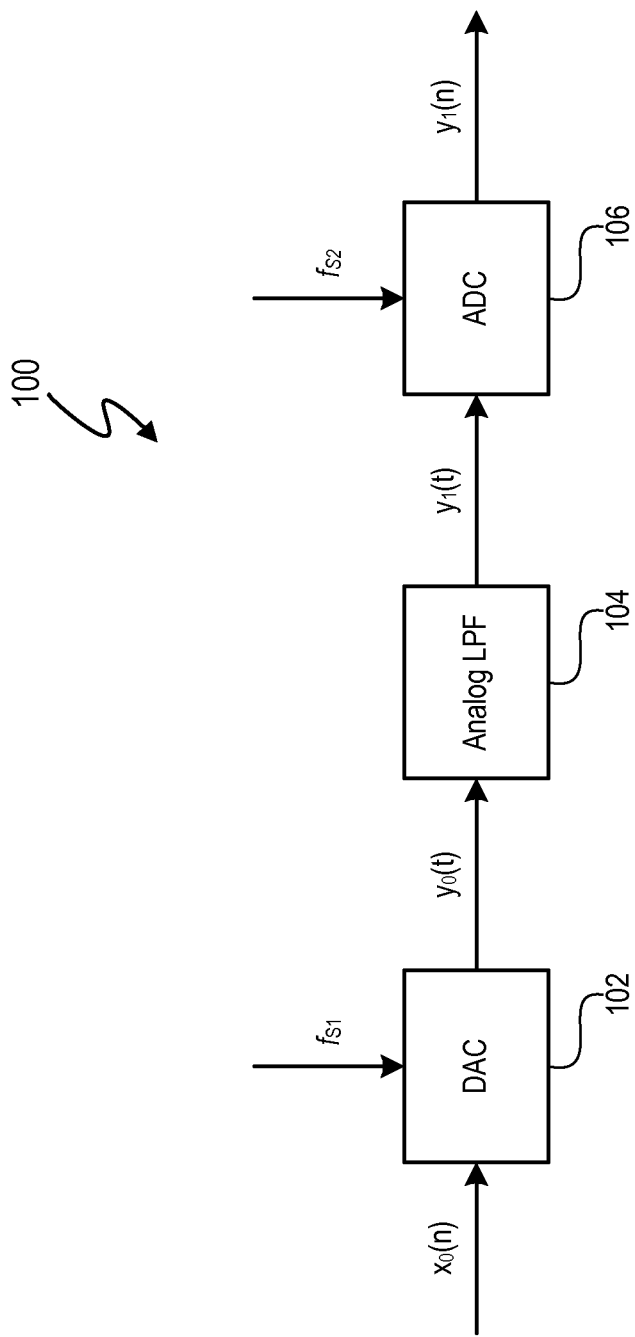
FIG. 1 (labeled prior art) depicts a conceptual mixed signal sample rate converter.
Figure 2:
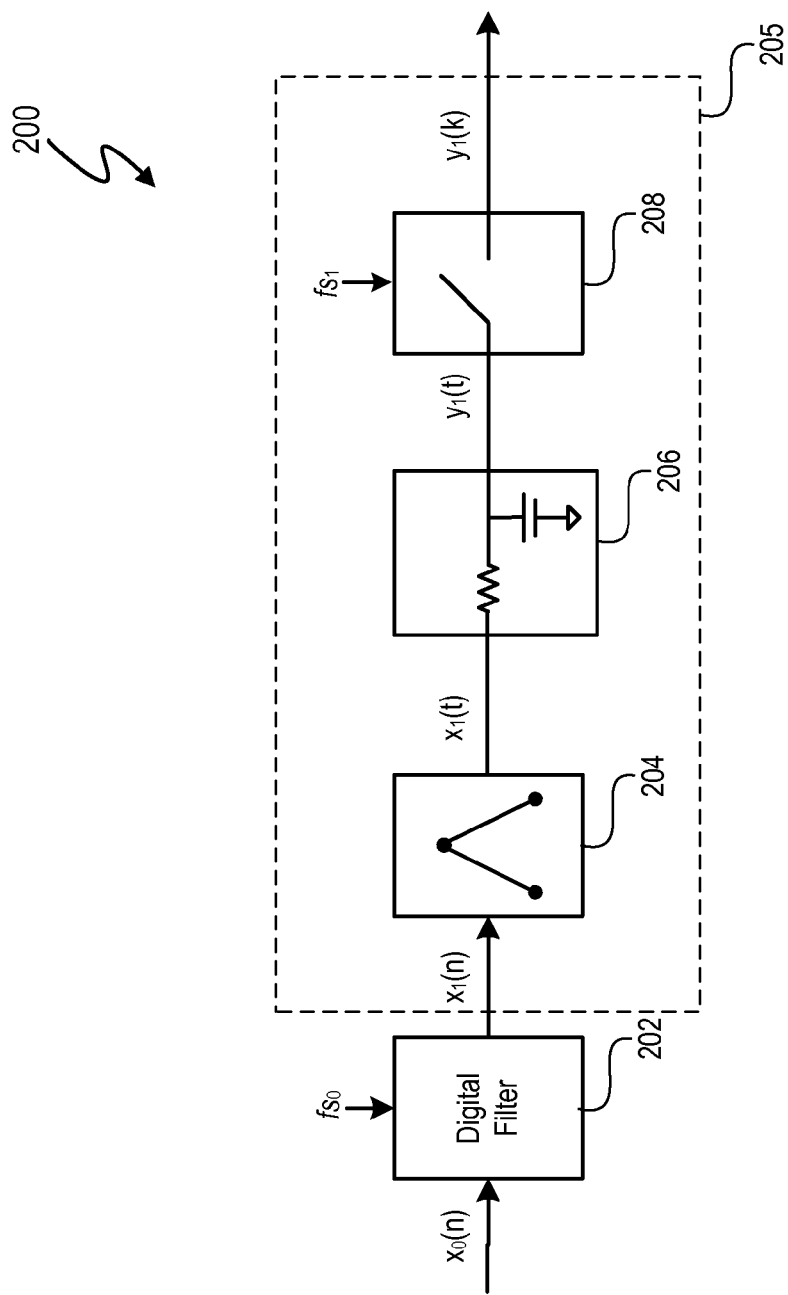
FIG. 2 depicts a mixed signal sample rate converter model.

FIG. 2 depicts one embodiment of a mixed signal SRC model 200. The mixed signal SRC system model 200 serves as a model for an all-digital SRC. A digital filter 202 with a low-pass response pre-filters the discrete time input signal $x_0(n)$ and generates discrete time signal $x_1(n)$. In at least one embodiment, digital filter 202 and a circuit section 205 collectively have a Butterworth or a Chebychev type filter response. In at least one embodiment, digital filter 202 and section 205 collectively model an $N^{th}$ order filter with section 205 being a last stage, first order filter model. "N" can represent any order greater than one. In at least one embodiment, if section 205 is first order, and digital filter 202 is implemented using one or more bi-quad filters, then N is odd. In general, larger values of N result in a more complex filter and can better model a continuous-time response.

Filter section 205 includes interpolator 204. Interpolator 204 models an interface between the discrete time section of filter 202 and the continuous time section of a model analog low pass filter ("LPF") 206. Interpolator 204 can implement linear or higher order interpolation. In at least one embodiment, interpolator 204 is a linear interpolator having a triangular impulse response. The convolution of the impulse response of interpolator 204 with the discrete time signal $x_1(n)$ generates a simulated continuous-time signal $x_1(t)$. The model analog LPF 206 attenuates frequencies above a predetermined cut-off frequency to generate continuous-time, filtered signal $y_1(t)$. In at least one embodiment, LPF 206 is modeled as a first order RC filter. The particular design of the LPF 206 is a matter of design choice and can be any LPF design. In simulation, first and second order versions of LPF 206 provide an SNR sufficient for high quality audio signals. Higher order versions of LPF 206 can be used; however, higher versions of LPF 206 are increasingly complex and are more difficult to implement.

A sampler 208 samples continuous-time signal $y_1(t)$ at sampling frequency $fs_1$ to generate a discrete time output signal $y_1(k)$ having a sampling frequency of $fs_1$.

A digital sample rate conversion filter can be designed from the SRC 200 using, for example, impulse invariant mapping to implement the LPF 206 in the discrete time domain. The impulse response of LPF 206 includes non-linear, exponential terms. To model the non-linear, exponential terms, the digital sample rate conversion filter uses a non-linear interpolation filter, and the complexity of the non-linear interpolation filter depends, at least in part, on the oversampling ratio of input signal $x_0(n)$. When the amount of oversampling is higher, the closer samples are to each other in time and the more linear the function is between two samples. Thus, higher oversampling ratios can use less complex non-linear interpolation functions.

Figure 3:
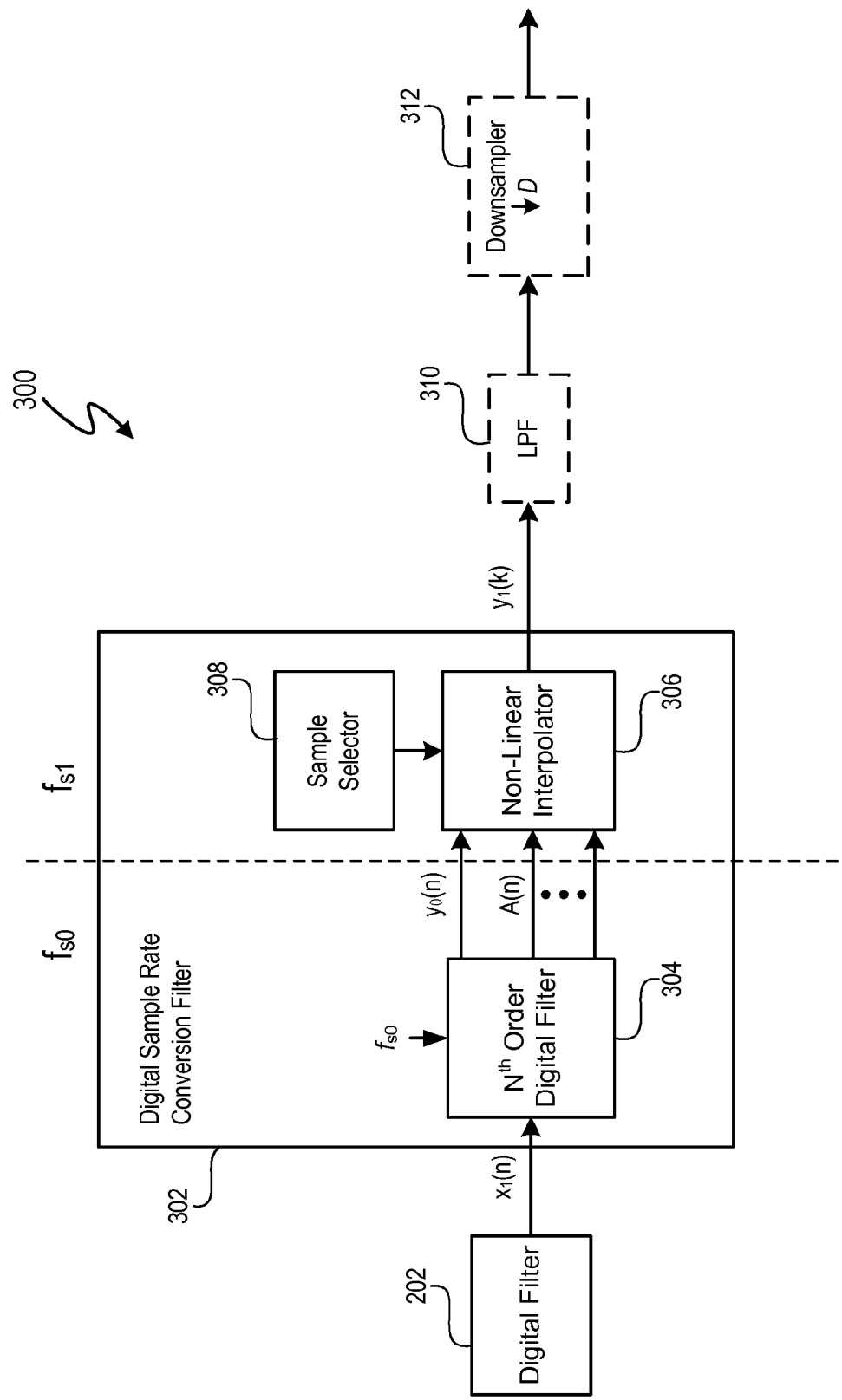
FIG. 3 depicts a digital sample rate converter.

FIG. 3 depicts digital sample rate converter 300 that converts a sampling frequency of discrete-time input signal $x_1(n)$ from frequency $fs_0$ to a sampling frequency $fs_1$. The discrete-time input signal $x_1(n)$ is represented by a series of discrete samples. The discrete samples represent values of, for example, a continuous time signal sampled at a sampling frequency of $fs_0$. The time difference between each sample equals $1/fs_0$.

The sample rate converter 300 includes digital filter 202 and a digital sample rate conversion filter 302. The digital sample rate conversion filter 302 simulates section 205 of SRC 200. The digital sample rate conversion filter 302 includes an $N^{th}$ order digital filter 304, where N is an integer greater than or equal to one. In at least one embodiment, an impulse response of digital filter 304 models a response of a continuous time filter such as the continuous-time LPF 206 (FIG. 2). In at least one embodiment, N equals one. The complexity and order of the digital filter 304 are a matter of design choice and depend, at least in part, on the desired performance of the sample rate converter 300. More complex digital filters 304 and non-linear interpolators can, in general, provide more accurate simulation of an emulated mixed signal SRC.

The impulse response of digital filters 202 and 304 can be designed by determining a desired frequency response of the continuous time filter and using, for example, impulse invariant mapping techniques to determine the characteristics of digital filters 202 and 304. In audio applications, the continuous time filter is generally a low pass filter having a cut-off frequency above 20 kHz for audio applications. Impulse invariant mapping represents one digital filter design technique that can be used to convert the determined desired frequency response of the continuous time filter into the impulse response of the digital filters 202 and 304. Thus, the digital filters 202 and 304 modify the values of discrete-time input signal $x(n)$ in accordance with the impulse response of digital filters 202 and 304 to generate discrete-time output signal $y_0(n)$. In at least one embodiment, an impulse response of LPF 206 can be mathematically represented by Equation [1]:

$$e^{-\alpha x} \quad [1],$$

where $\alpha$ represents a filter time constant and $e^x$ can be represented by the Taylor series expansion of Equation [2]:

$$e^x = \sum_{n=0}^{\infty} \frac{x^n}{n!} = 1 + x + \frac{x^2}{2} + \frac{x^3}{6} + \ldots . \quad [2]$$

In at least one embodiment, the exponential of Equation [1] is approximated by a polynomial.

In addition to the output signal $y_0(n)$, digital filter 204 generates other output data streams, which are collectively referred to as auxiliary data $A(n)$. In at least one embodiment, the auxiliary data $A(n)$ is distinct from the filtered output signal $y_0(n)$.

In at least one embodiment, the digital filters 202 and 304 operate at the sampling frequency $fs_0$. The non-linear interpolator 306 and sample selector 308 operate at the sampling frequencies $fs_1$. In general, to distinguish between samples determined at sampling frequencies $fs_0$ or $fs_1$, the nomenclature "(n)" is used for samples sampled at $fs_0$ and "(k)" for samples sampled at $fs_1$.

Non-linear interpolator 306 utilizes a non-linear impulse response to determine interpolated sample values from the output samples $y_0(n)$ and auxiliary data $A(n)$ of digital filter 304 to generate output signal $y_1(k)$ at a sampling frequency $fs_1$. Interpolation generates additional samples between the samples of output signal $y_0(n)$ to provide samples at a sampling frequency $fs_1$ that also approximate a continuous time output signal of the model analog LPF 206. In at least one embodiment, interpolator 306 is a digital processing system, and the non-linear impulse response of interpolator 306 is a matter of design choice. The interpolated sample values follow a non-linear function between adjacent values of output signal $y_0(n)$ in order to better model the curvature of the response of the modeled continuous time LPF 206.

The sample rate converter 300 also includes a sample selector 308 to determine when to generate interpolated samples and the amount of time offset from an adjacent sample generated by the digital filter so that the interpolated samples are generated at a sampling frequency of $fs_1$. Each sample of output signal $y_1(n)$ and auxiliary data $A(n)$ is associated with a particular time. For example, in at least one embodiment, $y_1(0)$ is associated with time $t_0$, $y_1(1)$ is associated with time $t_1$, etc. In at least one embodiment, the sample selector 308 is a rate estimator that determines when to select a sample of output signal $y_0(n)$ and samples of auxiliary data $A(n)$ and determines a time offset from the selected samples to generate the next sample of output signal $y_1(k)$ so that the interpolated samples are generated at a sampling frequency of $fs_1$. For the $k^{th}$ sample of output signal $y_1(k)$, the sample selector 308 selects the $n^{th}$ sample of output signal $y_0(n)$ and auxiliary data $A(n)$, using Equation [3]:

$$n = k \cdot (\text{int}[fs_0/fs_1]) \quad [3]$$

wherein n is an index to identify the selected sample from samples generated at a sampling frequency $fs_0$, k is an index to identify a sample selected at frequency $fs_1$, and "int[x]" returns the integer portion of a real number x rounded down. Many sample selection and fractional offset determination techniques are well-known and can implement sample selector 308.

The time offset is also a function of sampling frequencies $fs_0$ and $fs_1$, and, in at least one embodiment, the time offset $s(k)$ is determined in accordance with Equation [4]:

$$s(k) = [k \cdot (fs_0/f_{s1})] - n \quad [4]$$

Figure 4:
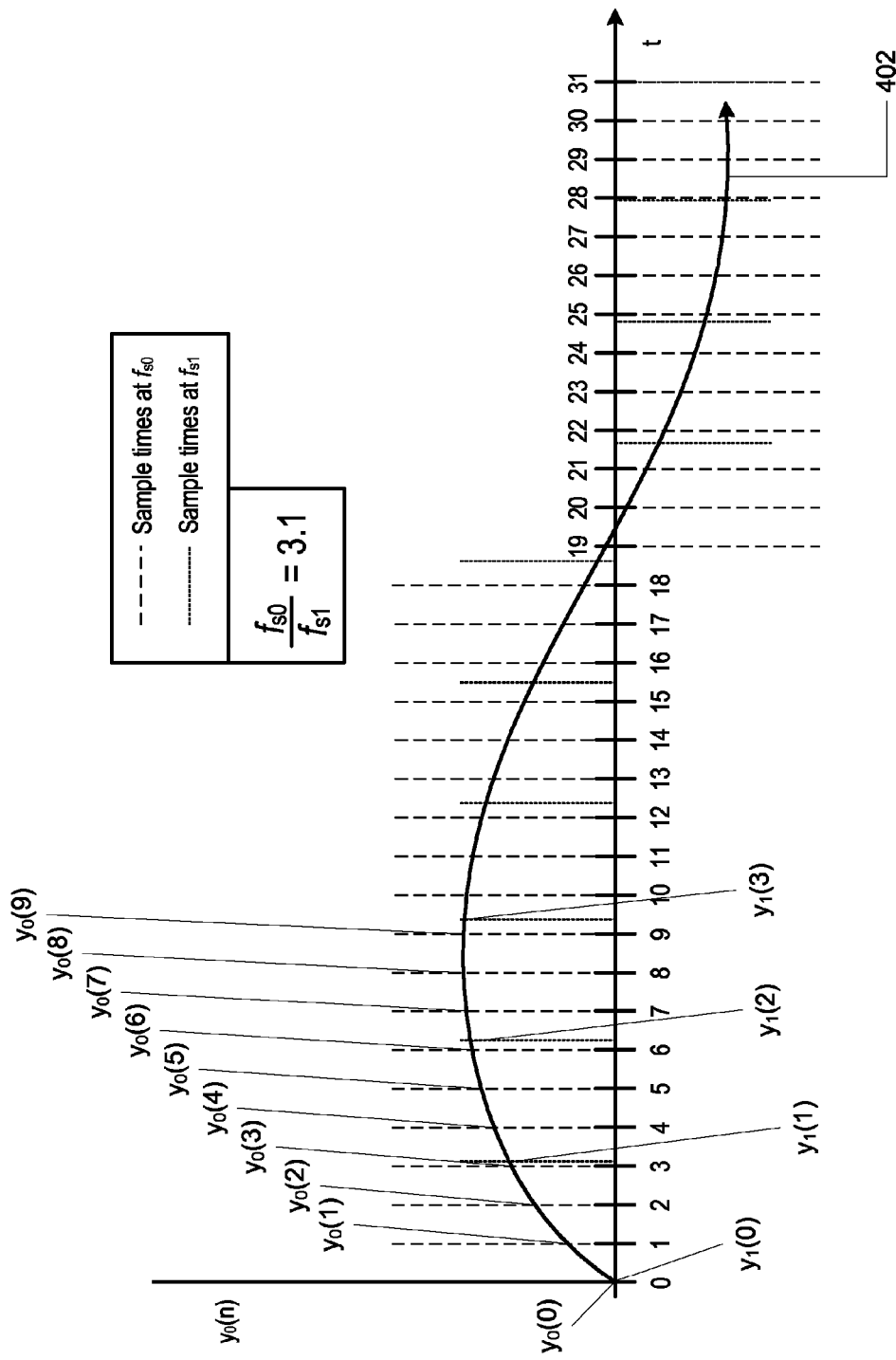
FIG. 4 depicts an exemplary continuous time signal and discrete-time samples at two exemplary sampling frequencies.

Referring to FIGS. 3 and 4, FIG. 4 depicts an exemplary continuous time signal 402 and discrete-time samples $y_x(w)$ at exemplary sampling frequencies $fs_0$ and $fs_1$. The samples of output signal $y_0(n)$ correspond to samples of the continuous time signal 402 at sample times $t_0, t_1, t_2$, and so on, where $(t_{n+1} - t_n) = 1/fs_0$. As previously stated, the sample rate converter 300 converts input signal $x(n)$, sampled at a sampling frequency of $fs_0$, into a corresponding output signal $y_1(k)$, having a sampling frequency of $fs_1$. Because of a possible difference error between an interpolated sample value of output signal $y_1(k)$ and a corresponding value of the continuous time signal 402, a "corresponding" output signal $y_1(k)$ is equivalent to input signal $x(n)$ within this margin of error.

The values of sampling frequencies $fs_0$ and $fs_1$ are generally respectively established by a first device (not shown) providing an input signal to digital filter 202 and a second device (not shown) that receives the output signal of sample rate converter 300. For example, if the ratio of $fs_0$ to $fs_1$ is 3.1:1 as illustrated in FIG. 4, sample selector 308 selects samples $y_0(0), y_0(3), y_0(6)$, and so on in accordance with Equation [3] to generate output signal samples $y_1(0), y_1(1), y_1(2)$, etc. In accordance with Equation [4], the time offset for sample $y_0(0)$ is 0, the time offset for $y_0(3)$ is 0.1, i.e. 3.1-3, the time offset for $y_0(6)$ is 0.2, i.e. (2)(3.1)-6, and so on. When the time offset is non-zero, the output signal sample $y_1(k)$ is generated by non-linearly interpolating between the selected sample of output signal $y_0(n)$ and the next output signal sample $y_0(n+1)$ using the time offset to determine the particular interpolated value. For example, for linear interpolation, the interpolated value $y_1(k)$ equals $\{y_0(n) + s(k) \cdot f([y_0(n+1) - y_0(n)])\}$, where $f([y_0(n+1) - y_0(n)])$ is the non-linear response of non-linear interpolator 306 to $[(y_0(n+1) - y_0(n)]$. When the time offset is zero, the selected sample of output signal $y_0(n)$ can be selected directly. The sample rate converter 300 optionally includes an additional low pass filter 310 to filter output signal $y_1(n)$ and a downsampler 312, such as a decimation filter, that downsamples the output of the low pass filter 310 by a factor of D, where D is a real number and generally an integer greater than one.

Figure 5:
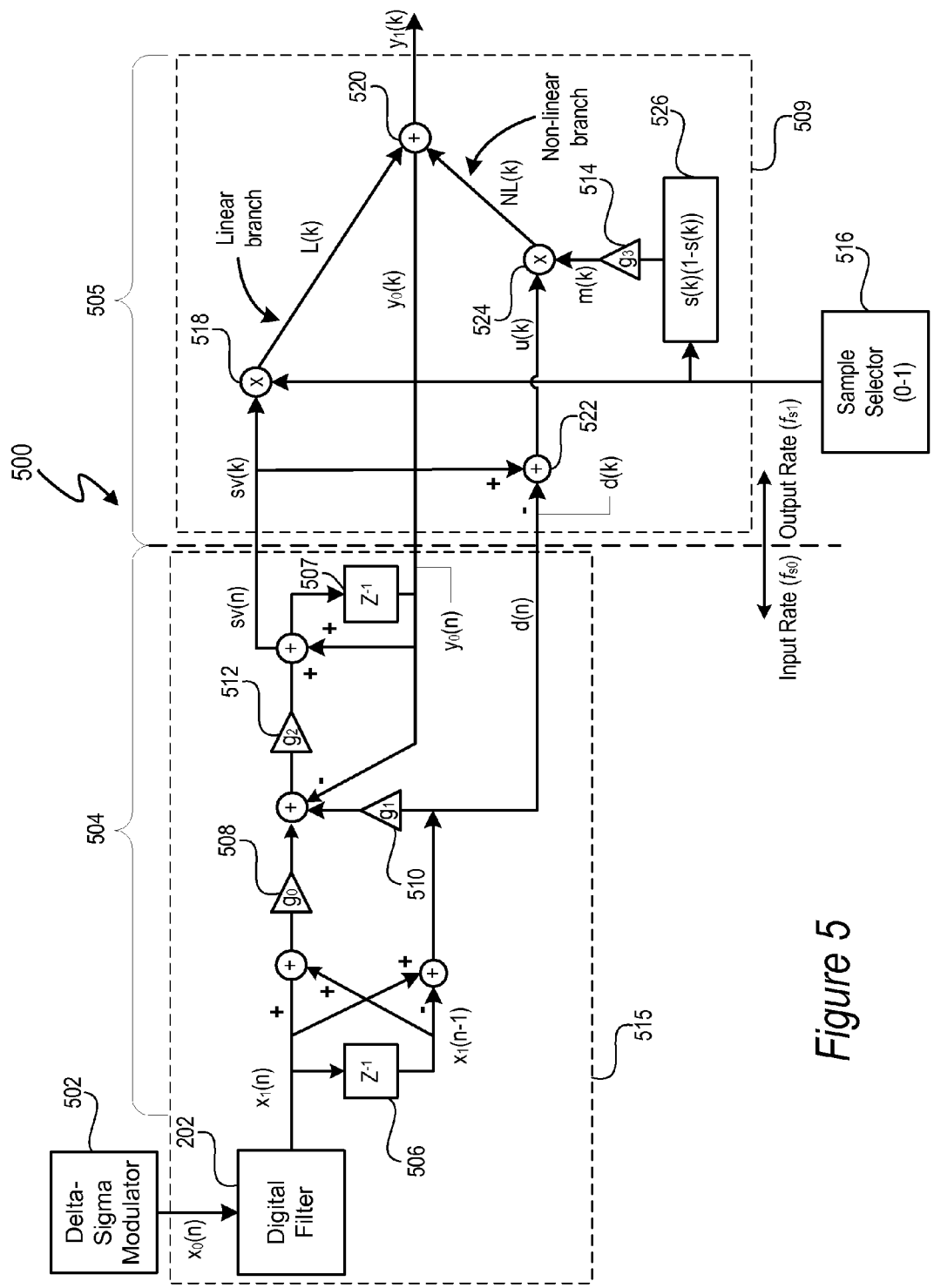
FIG. 5 depicts a digital sample rate converter.
Figure 11:
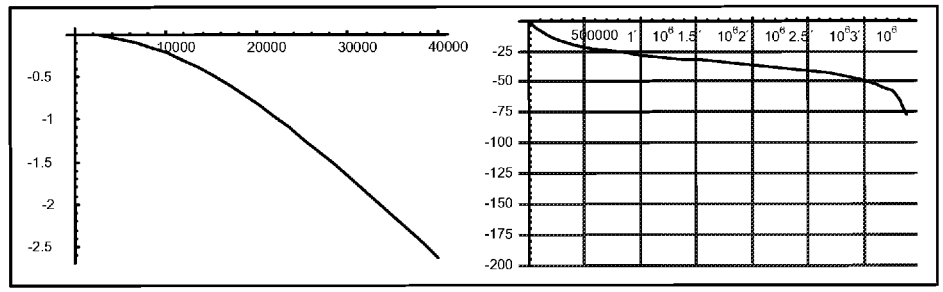
Figure 12:
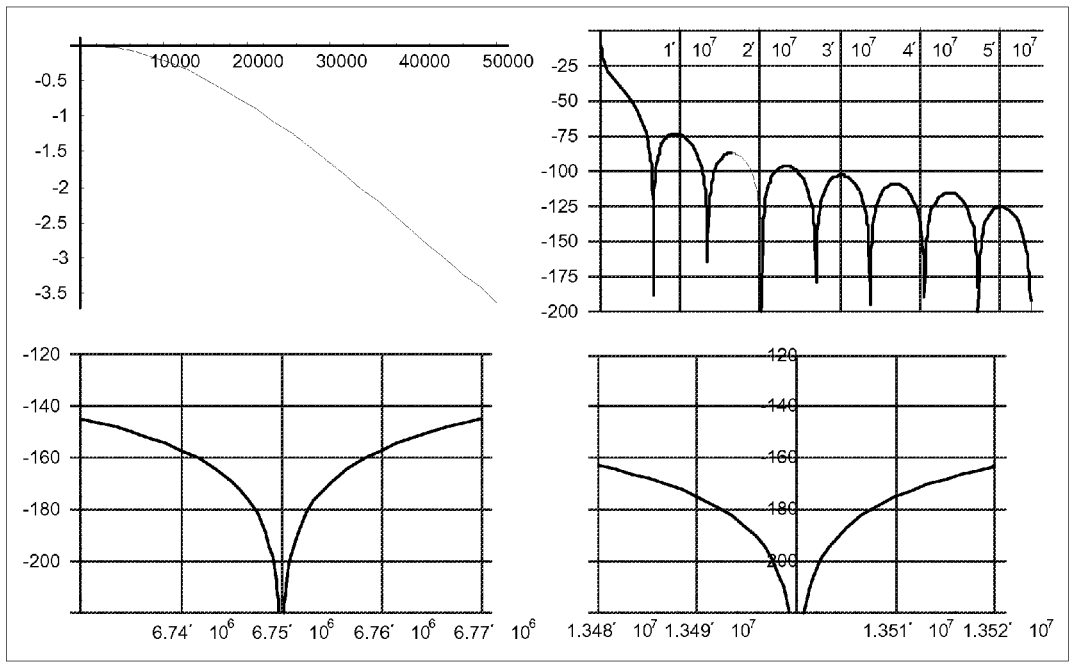
Figure 22:
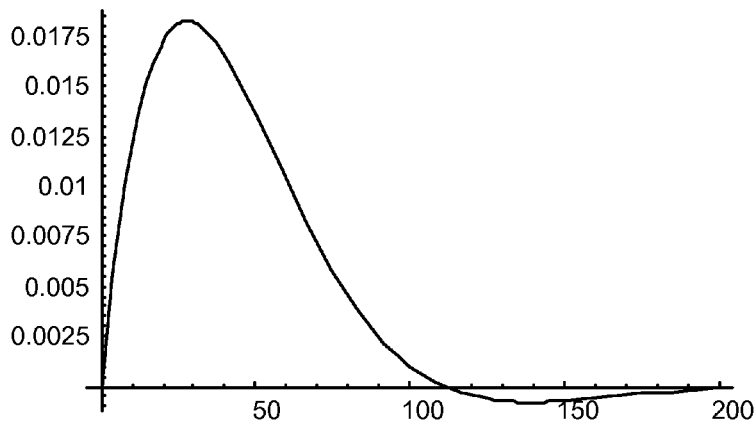
Figure 24:
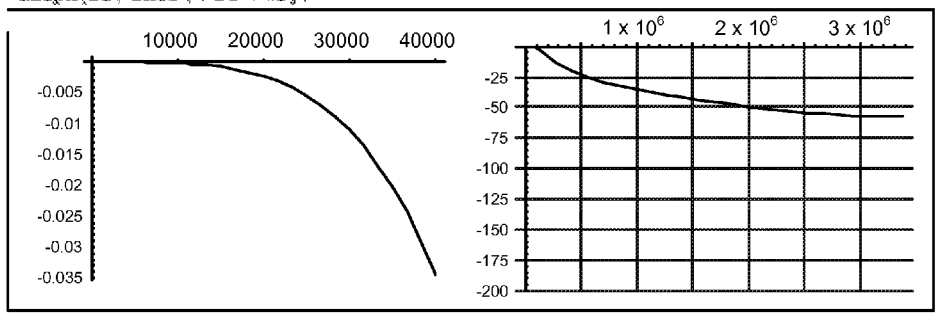
Figure 26:
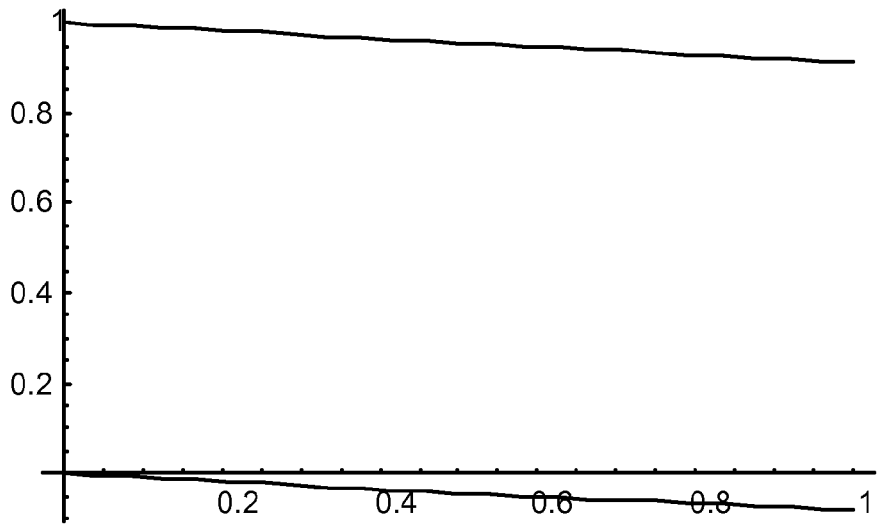

FIG. 5 depicts sample rate converter 500, which is one embodiment of sample rate converter 300. The sample rate converter 500 includes a symbolic representation of the sample rate converter designed pursuant to the program and simulation results of FIGS. 6-20. The sample rate converter 500 simulates sample rate converter 200. In at least one embodiment, a delta sigma modulator 502 provides a digital input signal $x_0(n)$ at a sampling frequency $fs_0$. Sections 504 and 505 represent one embodiment of digital sample rate conversion filter 302. Section 504 of sample rate converter 500 operates at the sampling frequency of $fs_0$, and section 505 of sample rate converter 500 operates at the sampling frequency of $fs_1$. In at least one embodiment, $fs_0$ equals 6.75 MHz, and $fs_1$ equals 192 kHz.

The sample rate converter 500 uses multiple data streams from a digital IIR filter and non-linear interpolation to determine output samples of output signal $y_1(k)$. In at least one embodiment, one of the data streams provides output samples of the IIR filter to a non-linear interpolator and other data streams provide auxiliary data used to interpolate between two adjacent output samples of the IIR filter.

The $z^{-1}$ operators 506 and 507 each represent a unit delay, and each of gains $g_0$ through $g_3$ represents a multiplier between the input and output of respective gain stages 508, 510, 512, and 514. Table 1 contains exemplary values of gains $g_0$ through $g_3$ as determined in FIGS. 6-20:

TABLE 1

| Gain | Gain Value |
|---|---|
| $g_0$ | 0.5 |
| $g_1$ | 0.0034 |
| $g_2$ | 0.04 |
| $g_3$ | −0.02041 |

Digital filter 202 and section 504 collectively form infinite impulse response (IIR) filter 515. IIR filter 515 represents one embodiment of the $N^{th}$ order combination of digital filters 202 and 304 (FIG. 3). In at least one embodiment, section 504 represents a first order, last stage of IIR filter 515. Section 505 includes non-linear interpolator 509 and sample selector 516. Interpolator 509 represents one embodiment of interpolator 306. IIR filter 504 generates and provides multiple data streams to interpolator 509. IIR filter 504 generates a digital filter output signal $y_0(n)$ with a sampling frequency of $fs_0$. IIR filter 504 also generates one embodiment of auxiliary data $A(n)$. In at least one embodiment, auxiliary data $A(n)$ represents two data streams sv(n) and d(n). State variable sv(n) represents the first data stream. The $k^{th}$ sample of state variable sv(n), i.e., state variable sv(k), is used by interpolator 507 to generate a linearly interpolated value of output signal $y_0(n)$. Filter data d(n) represents the second data stream. The $k^{th}$ sample of filter data d(n), i.e., filter data sample d(k), is used by interpolator 507 to generate a non-linearly interpolated value of output signal $y_1(k)$. In one embodiment, samples sv(k) and d(k) are respectively determined in accordance with Equations [5] and [6]:

$$sv(k)=g_2\{g_0\cdot[x_1(k)+x_1(k-1)]+g_1\cdot[x_1(k)-x_1(k-1)]-sv(k-1)\}+sv(k-1); \text{ and} \quad [5]$$

$$d(k)=x(k)-x(k-1). \quad [6]$$

The sample selector 516, representing one embodiment of sample selector 308, uses Equations [3] and [4] to determine when to generate interpolated samples from output signal $y_0(n)$ and the amount of time offset between adjacent samples of the selected output signal $y_0(n)$. Sample selector 516 generates a selection signal s(k) with a value ranging from 0 to 1. Multiplier 518 multiplies the selection signal s(k) with the filter data d(k) to generate linear branch modifying signal L(k).

To obtain a better SNR, sample rate converter 500 uses non-linear interpolation to correct errors between the linear branch modifying signal L(k) and the continuous-time signal generated by the modeled analog LPF 206. The sample rate converter 500 generates a non-linear modifying factor using, for example, a parabolic function based on the impulse response of the modeled analog LPF 206. For example, in one embodiment, the parabolic function s(k)[1−s(k)] is used. The output of parabolic function 526 times gain $g_3$ of gain stage 514 generates a modifying factor m(k). Summer 522 sums −d(k) and sv(k) to generate signal u(k), i.e. u(k)=sv(k)−d(k). Signal u(k) represents a difference between input and output slopes of IIR filter 515 and, thus, represents a measure of curvature of the output signal $y_0(n)$ when the input/output relationship of IIR filter 515 is non-linear.

Multiplier 524 multiplies the modifying factor m(k) by signal u(k) to generate a non-linear branch modifying factor NL(k), i.e., NL(k)=m(k)·u(k). In at least one embodiment, summer 520 sums linear and non-linear branch modifying signals L(k) and NL(k) with digital filter output signal $y_0(k)$ to generate the output signal $y_1(k)$. Since the continuous time signal corresponding to output signal $y_1(k)$ is non-linear, the non-linear branch modifying signal NL(k) corrects the linear branch modifying signal L(k) to more closely match the corresponding continuous time signal and, thus, increase the SNR of sample rate converter 500. Output signal $y_1(k)$ has a sampling frequency of $fs_1$ and corresponds to the digital input signal x(n) having a sampling frequency of $fs_0$. From simulation, for input signal $x_0(n)$ having an oversampling ratio of 128:1, sample rate conversion by sample rate converter 500 using non-linear interpolation improves accuracy and SNR as set forth in exemplary Table 2:

TABLE 2

| Interpolation | $y_1(k)$ Bits of Accuracy | Approx. SNR (−dB) |
| --- | --- | --- |
| Zero Order Hold | 7 | 42 |
| Linear | 14 | 84 |
| Non-linear | 21 | 120 |

FIGS. 6-20 depict a Mathematica® program and accompanying simulated signal plots that can be used with software available from Wolfram Research, Inc. having offices in Champaign, Ill., USA (Wolfram). The program depicts the design and simulation of a low pass continuous-time filter and modeling of the low pass continuous-time filter for inclusion in a sample rate converter (SRC). The continuous-time filter is specifically designed to pass audio input signal baseband (e.g. 0-20 kHz) signals and attenuate out-of band (i.e. greater than 20 kHz) signals. In at least one embodiment, the input signal x(n) the output signal of a delta sigma modulator. The delta sigma modulator has a sampling frequency of approximately 6.75 MHz. The digital sample rate conversion filter of the program provides low pass filtering and significant attenuation at the delta sigma modulator sampling frequency +/−20 kHz to prevent aliasing into the baseband.

FIGS. 21-27 depict a Mathematica® program and accompanying simulated signal plots. The program depicts a second order Butterworth filter that can be used to model the continuous-time portion of sample rate converter 200. The program and simulation results of FIGS. 21-27 demonstrate that the simulated analog circuit of FIG. 2 is not limited to a simple RC. In the case of FIGS. 21-27, the emulated circuit is a second order resonator. The impulse response of the exemplary second order resonator is an exponentially decaying sinusoid, commonly referred to as a complex exponential.

As the order of the simulated analog circuit, such as the combination of filters 202 and 304 (FIG. 2) increases, the attenuation of alias components increases. The complexity of implementation also increases. Fortunately, the complex part of the implementation is confined to the output rate section, such as $N^{th}$ order digital filter 304, which will often be operated at a lower rate than the input section, such as digital filter 202. This makes more complex systems well suited to software implementation on a digital signal processor, where the input rate filter may be implemented in hardware.

More accuracy is generally needed when the oversample ratio of the input signal, such as signal $x0(n)$ (FIG. 5), is low. The 120+ dB performance, as indicated in Table 2, of a simple RC implementation is achieved at a 128 oversample ratio. This performance is adequate for nearly any audio application. If the oversample ratio is low, options include using a more complex filter, or up-sampling the data to a higher oversample rate, and then using a simpler interpolator.

Generally, first and second filter sections of, for example, $N^{th}$ order digital filter 304 with N equal one or two, will perform adequately. Higher order analog simulation may be used, but most often the preferred embodiment will be a higher sampling rate.

Thus, the sample rate converter 200 uses a discrete-time representation of a continuous time signal and a digital sample rate conversion filter to perform sample rate conversion of an input signal and, thus, convert the sampling frequency of the input signal from sampling frequency $fs_0$ to sampling frequency $fs_1$.

Although the present invention has been described in detail, it should be understood that various changes, substitutions and alterations can be made hereto without departing from the spirit and scope of the invention as defined by the appended claims.

What is claimed is:

1. A sample rate converter circuit comprising:
   an input to receive a discrete-time input signal, wherein the discrete-time input signal includes first discrete-time samples obtained at a sampling frequency $f_{S0}$; and
   a digital sample rate conversion filter and interpolator, coupled to the input, having a transfer function modeled from a continuous-time filter, and the digital sample rate conversion filter comprises an infinite impulse response (IIR) filter, wherein the digital sample rate conversion filter is configured to (i) receive the input signal and (ii) generate output samples of the IIR filter having a sampling frequency of $f_{S0}$ and auxiliary data wherein the auxiliary data is distinct from the output samples of the IIR filter and comprises a plurality of values within the IIR filter, and the interpolator is configured to determine second discrete-time output samples from output samples of the IIR filter and the auxiliary data at a sampling frequency $f_{S1}$, the second discrete-time output samples having values temporally between values of adjacent-in-time samples of a subset of the output samples of the IIR filter, wherein (i) $f_{S0}$ does not equal $f_{S1}$ and (ii) the values of the output samples of the IIR filter are determined in accordance with the model of the continuous-time filter.

2. The sample rate converter circuit of claim 1 wherein the IIR filter is modeled from an impulse invariant model of the continuous-time filter and the continuous-time filter has a low-pass frequency response, and the digital sample rate conversion filter and interpolator comprises:
an interpolator, coupled to the IIR filter, to determine the second discrete-time samples; and
a sample selector, coupled to the interpolator, to cause the interpolator to determine the second discrete-time samples determine the second discrete-time samples.

3. The sample rate converter circuit of claim 2 wherein the sample selector is configured to determine when to generate the second discrete-time samples and an amount of time offset from at least one of the adjacent-in-time samples of the first discrete-time samples.

4. The sample rate converter circuit of claim 2 wherein the interpolator comprises a linear interpolator.

5. The sample rate converter circuit of claim 2 wherein the interpolator comprises a non-linear interpolator.

6. The sample rate converter circuit of claim 1 further comprising:
a delta sigma modulator, coupled to the input, to receive the continuous time signal and to generate the discrete-time input signal.

7. The sample rate converter circuit of claim 1 further comprising:
a rate estimator, coupled to the digital sample rate conversion filter, to select samples from the second discrete-time samples at the sampling $fs_1$.

8. The sample rate converter circuit of claim 1 wherein the digital sample rate conversion filter comprises:
an N-order digital filter, wherein at least one stage of the N-order digital filter comprises a discrete filter model of the continuous-time filter, wherein N is an integer; and
an interpolation filter, coupled to the discrete filter model.

9. The sample rate converter circuit of claim 8 wherein the first N-stages of the N order digital filter have a Butterworth type filter response and a last stage for the N order digital filter is the infinite impulse response filter, wherein the infinite impulse response filter is a first order infinite impulse response filter.

10. The sample rate converter circuit of claim 1 wherein the sample rate converter is an all-digital sample rate converter.

11. The sample rate converter circuit of claim 1 wherein the discrete-time input signal comprises an oversampled audio input signal.

12. The sample rate converter circuit of claim 1, wherein the sample rate converter circuit comprises a member of a group consisting of: discrete components, an integrated circuit, a processor executing code, or any combination of discrete components, an integrated circuit, and a processor executing code.

13. A digital sample rate converter circuit comprising:
a signal generator to generate a discrete-time signal having a sampled frequency of $fs_0$;
a discrete-time filter comprising an infinite impulse response (IIR) filter and coupled to the signal generator, to receive the discrete-time signal, modify the discrete-time signal in accordance with a low-pass frequency operation, and generate filtered output samples of the IIR filter and auxiliary data, wherein the auxiliary data is distinct from the filtered output signal and comprises a plurality of values within the IIR filter; and
an interpolator to receive the auxiliary data and a subset of the filtered output samples and to determine interpolated sample values temporally between values of the filtered output samples of the IIR filter, wherein the interpolated sample values have a sampling frequency of $fs_1$, wherein $fs_1$ is not equal to $f_{s0}$, and the values of the output samples of the IIR filter are determined in accordance with a model of a continuous-time filter.

14. The digital sample rate converter circuit of claim 13 further comprising:
a sample selector to select, at the sampling frequency $fs_1$, samples of the filtered output samples and the auxiliary data for interpolation.

15. The digital sample rate converter circuit of claim 13 wherein the auxiliary data comprises two state variables of the discrete-time filter.

16. The digital sample rate converter circuit of claim 13 wherein the discrete-time filter and discrete-time interpolator are modeled from interpolation of the discrete-time signal to generate a continuous-time interpolated signal and continuous-time filtering of the interpolated signal.

17. The digital sample rate converter circuit of claim 13 wherein the signal generator comprises a delta sigma modulator.

18. The digital sample rate converter circuit of claim 13 wherein the discrete-time filter comprises:
an N-order digital filter, wherein at least one stage of the N-order digital filter comprises a discrete filter model of a continuous time filter, wherein N is an integer.

19. The digital sample rate converter circuit of claim 13 wherein the interpolator is configured to non-linearly interpolate the received subset of the filtered output samples.

20. The digital sample rate converter circuit of claim 13 further comprising:
a decimation filter, coupled to the interpolator, to decimate the interpolated sample values by a factor of M, wherein M is a real number greater than one.

21. The digital sample rate converter circuit of claim 13 wherein the discrete-time input signal comprises an oversampled audio input signal.

22. The digital sample rate converter circuit of claim 13, wherein the digital sample rate converter circuit comprises a member of a group consisting of: discrete components, an integrated circuit, a processor executing code, or any combination of discrete components, an integrated circuit, and a processor executing code.

23. A method of converting a first sample rate of a discrete-time input signal to a second sample rate, the method comprising:

in a circuit:
  receiving the discrete-time input signal;
  digitally filtering the discrete-time input signal using a filter, which includes an infinite impulse response (IIR) filter, that implements a digital model of a continuous time filter to generate first discrete-time filtered samples having a sampling frequency of $f_{S0}$ and auxiliary data; and
  determining second discrete-time output samples, at a sampling frequency of $f_{S1}$, from output samples of the IIR filter and the auxiliary data, wherein the auxiliary data is distinct from the output samples of the IIR filter and comprises a plurality of values within the IIR filter, the second discrete-time output samples having values temporally between values of adjacent-in-time values of the first discrete-time filtered samples of a subset of the first discrete-time samples, wherein $f_{S0}$ does not equal $f_{S1}$, and the values of the output samples of the IIR filter are determined in accordance with the model of the continuous-time filter.

24. The method of claim 23 wherein determining second discrete-time samples, at a sampling frequency of $fs_1$, having values between values of adjacent-in-time output values of the infinite impulse response filter samples of a subset of the first discrete-time samples comprises:
  selecting samples, at a sampling frequency of $fs_1$, from the first discrete-time filtered samples; and
  interpolating the selected samples to generate the second discrete-time samples.

25. The method of claim 24 wherein interpolating the selected samples to generate the second discrete-time samples comprises non-linearly interpolating the selected samples to generate the second discrete-time samples.

26. The method of claim 23 wherein:
  digitally filtering the discrete-time input signal comprises:
  low-pass filtering the discrete-time input signal using the infinite impulse response filter.

27. The method of claim 23, wherein the circuit comprises a member of a group consisting of: discrete components, an integrated circuit, a processor executing code, or any combination of discrete components, an integrated circuit, and a processor executing code.

28. A method of converting a discrete-time input signal sampled at a frequency $fs_0$ into a discrete-time output signal sampled at a frequency $fs_1$, the method comprising:
  in a circuit:
    receiving the discrete-time input signal;
    filtering the discrete-time input signal using an infinite impulse response (IIR) filter to generate filtered output samples and auxiliary data within the infinite impulse response filter, wherein the auxiliary data is distinct from the filtered output signal and comprises a plurality of values within the IIR filter; and
    interpolating the auxiliary data and a subset of the filtered output samples to determine the discrete-time output signal sample values temporally between values of the filtered output samples, wherein the discrete-time output signal sample values have a sampling frequency of $fs_1$, wherein $fs_1$ is not equal to $f_{s0}$, and the values of the output samples of the IIR filter are determined in accordance with a model of a continuous-time filter.

29. The method of claim 28 further comprising:
  selecting samples of the filtered output samples and the auxiliary data for interpolation at the sampling frequency $f_{s1}$.

30. The method of claim 28 wherein the auxiliary data comprises two state variables of the discrete-time filter.

31. The method of claim 28 wherein filtering the discrete-time input signal to generate filtered output samples and auxiliary data comprises:
  filtering the discrete-time input signal using the infinite impulse response filter having an impulse response modeled from continuous-time filter.

32. The method of claim 28 further comprising:
  decimating the interpolated sample value discrete-time signal by a factor of M, wherein M is a real number greater than one.

33. The method of claim 28 wherein the discrete-time input signal comprises an oversampled audio input signal.

34. The method of claim 28, wherein the circuit comprises a member of a group consisting of: discrete components, an integrated circuit, a processor executing code, or any combination of discrete components, an integrated circuit, and a processor executing code.

* * * * *